(12) United States Patent
Jiang et al.

(10) Patent No.: US 12,424,256 B2
(45) Date of Patent: *Sep. 23, 2025

(54) CIRCUIT DESIGN AND LAYOUT WITH HIGH EMBEDDED MEMORY DENSITY

(71) Applicant: Taiwan Semiconductor Manufacturing Company, Ltd., Hsinchu (TW)

(72) Inventors: Fa-Shen Jiang, Taoyuan (TW); Hsia-Wei Chen, Taipei (TW); Hsun-Chung Kuang, Hsinchu (TW); Hai-Dang Trinh, Hsinchu (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/589,540

(22) Filed: Feb. 28, 2024

(65) Prior Publication Data

US 2024/0203472 A1   Jun. 20, 2024

Related U.S. Application Data

(63) Continuation of application No. 18/076,801, filed on Dec. 7, 2022, now Pat. No. 11,961,545, which is a
(Continued)

(51) Int. Cl.
*G11C 11/16* (2006.01)
*G11C 11/56* (2006.01)
(Continued)

(52) U.S. Cl.
CPC ........ *G11C 11/161* (2013.01); *G11C 11/1657* (2013.01); *G11C 11/1659* (2013.01);
(Continued)

(58) Field of Classification Search
CPC .............. G11C 11/161; G11C 11/1657; G11C 11/1659; G11C 11/5614; G11C 11/5657;
(Continued)

(56) References Cited

U.S. PATENT DOCUMENTS

| | | | |
|---|---|---|---|
| 5,940,319 A * | 8/1999 | Durlam | G11C 11/15 365/158 |
| 7,248,498 B2 * | 7/2007 | Nazarian | G11C 13/003 365/158 |

(Continued)

FOREIGN PATENT DOCUMENTS

JP   2007294925 A   11/2007

OTHER PUBLICATIONS

Non-Final Office Action dated May 10, 2022 for U.S. Appl. No. 17/379,025.
(Continued)

*Primary Examiner* — Fernando Hidalgo
(74) *Attorney, Agent, or Firm* — Eschweiler & Potashnik, LLC

(57) ABSTRACT

Various embodiments of the present disclosure are directed towards a memory device. The memory device has a first transistor having a first source/drain and a second source/drain, where the first source/drain and the second source/drain are disposed in a semiconductor substrate. A dielectric structure is disposed over the semiconductor substrate. A first memory cell is disposed in the dielectric structure and over the semiconductor substrate, where the first memory cell has a first electrode and a second electrode, where the first electrode of the first memory cell is electrically coupled to the first source/drain of the first transistor. A second memory cell is disposed in the dielectric structure and over the semiconductor substrate, where the second memory cell has a first electrode and a second electrode, where the first
(Continued)

electrode of the second memory cell is electrically coupled to the second source/drain of the first transistor.

20 Claims, 12 Drawing Sheets

Related U.S. Application Data continuation of application No. 17/379,025, filed on Jul. 19, 2021, now Pat. No. 11,545,202.

(60) Provisional application No. 63/182,022, filed on Apr. 30, 2021.

(51) Int. Cl.
    *H10B 53/30*     (2023.01)
    *H10B 61/00*     (2023.01)
    *H10B 63/00*     (2023.01)

(52) U.S. Cl.
    CPC ...... *G11C 11/5614* (2013.01); *G11C 11/5657* (2013.01); *G11C 11/5678* (2013.01); *H10B 53/30* (2023.02); *H10B 61/22* (2023.02); *H10B 63/30* (2023.02)

(58) Field of Classification Search
    CPC ............ G11C 11/5678; G11C 13/0002; G11C 11/1675; G11C 7/18; G11C 8/14; H10B 53/30; H10B 61/22; H10B 63/30
    USPC .......................................... 365/158
See application file for complete search history.

(56) References Cited

U.S. PATENT DOCUMENTS

| | | | |
|---|---|---|---|
| RE46,920 E | 6/2018 | Fujita et al. | |
| 11,450,909 B2 | 9/2022 | Koshiol et al. | |
| 11,545,202 B2 | 1/2023 | Jiang et al. | |
| 11,961,545 B2* | 4/2024 | Jiang | G11C 11/5614 |
| 2006/0039183 A1* | 2/2006 | Lin | G11C 11/5607 |
| | | | 365/158 |
| 2009/0161413 A1* | 6/2009 | Yoon | G11C 11/1675 |
| | | | 365/158 |
| 2019/0019553 A1 | 1/2019 | Derner et al. | |
| 2020/0005844 A1 | 1/2020 | Alhalabi et al. | |
| 2021/0391383 A1 | 12/2021 | Lee et al. | |
| 2022/0069010 A1 | 3/2022 | Lee et al. | |

OTHER PUBLICATIONS

Notice of Allowance dated Aug. 22, 2022 for U.S. Appl. No. 17/379,025.
Non-Final Office Action dated Sep. 20, 2023 for U.S. Appl. No. 18/076,801.
Notice of Allowance dated Dec. 6, 2023 for U.S. Appl. No. 18/076,801.

\* cited by examiner

CIRCUIT DESIGN AND LAYOUT WITH HIGH EMBEDDED MEMORY DENSITY

REFERENCE TO RELATED APPLICATIONS

This Application is a Continuation of U.S. application Ser. No. 18/076,801, filed on Dec. 7, 2022, which is a Continuation of U.S. application Ser. No. 17/379,025, filed on Jul. 19, 2021 (now U.S. Pat. No. 11,545,202, issued on Jan. 3, 2023), which claims the benefit of U.S. Provisional Application No. 63/182,022, filed on Apr. 30, 2021. The contents of the above-referenced Patent Applications are hereby incorporated by reference in their entirety.

BACKGROUND

Many modern electronic devices contain electronic memory configured to store data. Electronic memory may be volatile memory or non-volatile memory. Volatile memory stores data while it is powered, while non-volatile memory is able to keep data when power is removed. Resistive random-access memory (RRAM) is one promising candidate for next generation non-volatile memory technology due to its simple structure and compatibility with complementary metal-oxide semiconductor (CMOS) logic processes. Some other candidates for next generation non-volatile memory include magnetoresistive random-access memory (MRAM), phase-change random-access memory (PCRAM), and ferroelectric random-access memory (FeRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
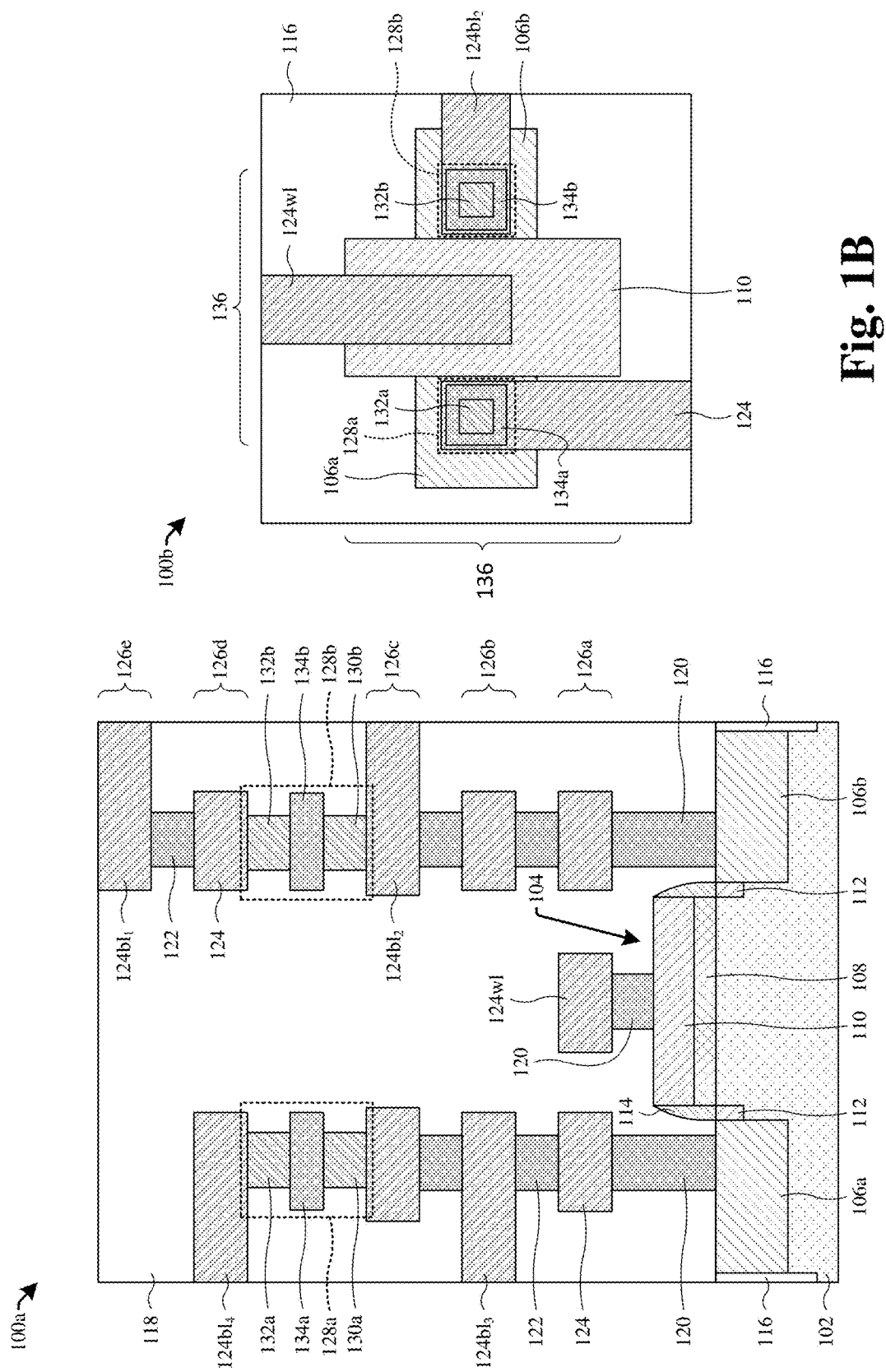
FIGS. 1A-1B illustrate various views of some embodiments of a memory device that has increased memory cell density and reduced crosstalk.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some memory devices (e.g., next generation memory devices) comprise a one transistor-one memory cell (1T1MC) device (e.g., one transistor-one resistor (1T1R) embedded memory cell architecture with an RRAM cell). The 1T1MC device comprises a resistive memory cell (e.g., RRAM cell) and an access transistor (or selector). The resistive memory cell is configured to store data based on a resistive state of the resistive memory cell. For example, the data storage structure may have a low resistance state associated with a first data state (e.g., binary "0") or a high resistance state associated with a second data state (e.g., binary "1"). The access transistor is coupled to the resistive memory cell to control access to the resistive memory cell during read and write operations. Typically, the memory device comprises a plurality of 1T1MC devices. The plurality of 1T1MC devices are disposed in an array and define a memory array of the memory device.

There is a continued effort to scale down feature sizes of the memory device to increase the number of memory cells per unit area (e.g., increase memory cell density). As the number of memory cells per unit area continues to increase, crosstalk increases (e.g., cross-talk between memory operations of 1T1MC devices). The crosstalk negatively affects the performance of the memory device (e.g., misreads, unintended switching of memory states, undesirable increases in power consumption, etc.). As such, a memory device that increases the number of memory cells per unit area (e.g., the number of memory cells per $4F^2$ cell area) while also reducing crosstalk is desirable.

Various embodiments of the present disclosure are directed toward a memory device that increases memory cell density (e.g., the number of memory cells per $4F^2$ cell area) while also reducing crosstalk. The memory device comprises a semiconductor device (e.g., metal-oxide-semiconductor field-effect transistor (MOSFET)) disposed on a semiconductor substrate. An interlayer dielectric (ILD) is disposed over the semiconductor substrate and the semiconductor device. A first memory cell (e.g., RRAM cell) and a second memory cell are disposed in the ILD structure and over the semiconductor substrate. The first memory cell is electrically coupled to a first source/drain region of the semiconductor device and the second memory cell is electrically coupled to a second source/drain region of the semiconductor device. The first memory cell and the second memory cell are disposed with a cell area (e.g., $4F^2$ cell area).

Because both the first memory cell and the second memory cell are disposed within the cell area, the memory device of the present application has a greater cell density (e.g., number of memory cells per unit area) than the typical memory device (e.g., only one memory cell per $4F^2$ cell area). Both the first memory cell and the second memory cell may be disposed within the cell area due to, at least partially, the first memory cell being electrically coupled to the first source/drain region and the second memory cell being electrically coupled to the second source/drain region. More specifically, because the first memory cell is electrically coupled to the first source/drain region and the second memory cell is electrically coupled to the second source/drain region, the first memory cell and the second memory cell may be disposed nearer one another (e.g., within the cell area). Further, the memory device of the present application may reduce or eliminate crosstalk (e.g., block-to-block crosstalk). The memory device of the present application reduces (or eliminates) crosstalk due to the specific manner in which the memory device is operated, which is described in more detail hereinafter. Thus, the memory device of the present application may increase the number of memory cells per unit area while also reducing crosstalk.

FIGS. 1A-1B illustrate various views 100a-b of some embodiments of a memory device that has increased memory cell density and reduced crosstalk. FIG. 1A illustrates a cross-sectional view 100a of a memory device that has increased memory cell density and reduced crosstalk. FIG. 1B illustrates a layout view 100b of some embodiments of the memory device of FIG. 1A.

As shown in the cross-sectional view 100a of FIG. 1A, the memory device comprises a substrate 102. The substrate 102 comprises any type of semiconductor body (e.g., monocrystalline silicon/CMOS bulk, germanium (Ge), silicon-germanium (SiGe), a III-V semiconductor, silicon on insulator (SOI), etc.).

A semiconductor device 104 (e.g., field-effect transistor (FET), metal-oxide-semiconductor field-effect transistor (MOSFETs), etc.) is disposed in/over the substrate 102. The semiconductor device 104 comprises a pair of source/drain regions 106a-b disposed in the substrate 102. The source/drain regions 106a-b are laterally spaced. For example, the pair of source/drain regions 106a-b comprises a first source/drain region 106a laterally spaced from a second source/drain region 106b. The source/drain regions 106a-b are portions of the substrate 102 having a first doping type (e.g., n-type).

The semiconductor device 104 comprises a gate dielectric 108 and a conductive gate electrode 110. The gate dielectric 108 is disposed over the substrate 102 and between the source/drain regions 106a-b. The conductive gate electrode 110 overlies the gate dielectric 108. In some embodiments, the gate dielectric 108 and the conductive gate electrode 110 are collectively referred to as a gate stack. In some embodiments, the conductive gate electrode 110 is or comprises polysilicon. In such embodiments, the gate dielectric 108 may be or comprise, for example, an oxide (e.g., silicon dioxide ($SiO_2$)). In other embodiments, the conductive gate electrode 110 may be or comprise a metal, such as aluminum (Al), copper (Cu), titanium (Ti), tantalum (Ta), tungsten (W), molybdenum (Mo), cobalt (Co), or the like. In such embodiments, the gate dielectric 108 may be or comprise a high-k dielectric material, such as hafnium oxide (HfO), tantalum oxide ($Ta_xO_y$), hafnium silicon oxide (HfSiO), hafnium tantalum oxide (HfTaO), aluminum oxide ($Al_xO_y$), zirconium oxide (ZrO), or the like.

In some embodiments, the semiconductor device 104 comprises a pair of lightly-doped source/drain extensions 112 disposed in the substrate 102. In other embodiments, the pair of lightly-doped source/drain extensions 112 are omitted. The gate dielectric 108 and the conductive gate electrode 110 are disposed between the lightly-doped source/drain extensions 112. The lightly-doped source/drain extensions 112 have a same doping type as the source/drain regions 106a-b. The lightly-doped source/drain extensions 112 have a lower concentration of first doping type dopants (e.g., n-type dopants, such as phosphorus, arsenic, antimony, etc.) than the source/drain regions 106a-b.

In some embodiments, a sidewall spacer 114 is disposed over the substrate 102. In other embodiments, the sidewall spacer 114 is omitted. The sidewall spacer 114 is disposed along sidewalls of the conductive gate electrode 110 and the gate dielectric 108. The sidewall spacer laterally surrounds the conductive gate electrode 110 and the gate dielectric 108. In some embodiments, the sidewall spacer 114 may be or comprise, for example, an oxide (e.g., $SiO_2$), a nitride (e.g., silicon nitride (e.g., SiN)), an oxy-nitride (e.g., silicon oxy-nitride ($SiO_xN_y$)), some other dielectric material, or a combination of the foregoing.

An isolation structure 116 is disposed in the substrate 102. The isolation structure 116 is configured to electrically isolate the semiconductor device 104 from other semiconductor devices (not shown) disposed in the substrate 102. In some embodiments, the isolation structure 116 comprises an oxide (e.g., $SiO_2$), a nitride (e.g., SiN)), an oxy-nitride (e.g., SiON), a carbide (e.g., silicon carbide (SiC)), some other dielectric material, or a combination of the foregoing. In further embodiments, the isolation structure 116 is a shallow trench isolation (STI) structure.

An interlayer dielectric (ILD) structure 118 is disposed over the substrate 102 and the semiconductor device 104. The ILD structure 118 comprises one or more stacked ILD layers, which may respectively comprise a low-k dielectric (e.g., a dielectric material with a dielectric constant less than about 3.9), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), or the like.

A plurality of conductive contacts 120 (e.g., metal contacts), a plurality of conductive vias 122 (e.g., metal vias), and a plurality of conductive lines 124 (e.g., metal lines) are disposed in the ILD structure 118. For clarity in the figures, only some of the conductive vias 122 and some of the conductive lines 124 are labeled in the figures. The plurality of conductive lines 124, the plurality of conductive vias 122, and the plurality of conductive contacts 120 are electrically coupled together in a predefined manner and are configured to provide electrical connections between various devices of the memory device. The conductive contacts 120 extend through the ILD structure 118 to contact the source/drain regions 106a-b and the conductive gate electrode 110. The plurality of conductive lines 124 and plurality of conductive vias 122 are disposed over the conductive contacts 120 and alternate back and forth from the conductive contacts 120 to an upper surface of the ILD structure 118.

In some embodiments, the plurality of conductive lines 124 and the plurality of conductive vias 122 may be or comprise, for example, copper (Cu), aluminum (Al), gold (Au), silver (Ag), platinum (Pt), or the like. In further embodiments, the plurality of conductive contacts 120 may be or comprise, for example, tungsten (W), copper (Cu), aluminum (Al), or the like. In yet further embodiments, the plurality of conductive lines 124, the plurality of conductive vias 122, and the plurality of conductive contacts 120 may be referred to as an interconnect structure.

The plurality of conductive lines 124 are disposed in a plurality of conductive layers 126a-c (e.g., metal layers). Each of the plurality of conductive layers 126a-e extend laterally through the ILD structure 118. Each of the plurality of conductive layers 126a-e comprise a group of one or more of the plurality of conductive lines 124. The plurality of conductive layers 126a-e are disposed over one another. The plurality of conductive vias 122 extend vertically between the plurality of conductive layers 126a-e and electrically couple the plurality of conductive lines 124 of the plurality of conductive layers 126a-e together in a predefined manner.

For example, as shown in the cross-sectional view 100a of FIG. 1A, the plurality of conductive layers 126a-e define a first conductive layer 126a (e.g., metal layer 1), a second conductive layer 126b (e.g., metal layer 2), a third conductive layer 126c (e.g., metal layer 3), a fourth conductive layer 126d (e.g., metal layer 4), and a fifth conductive layer 126e (e.g., metal layer 5) disposed in the ILD structure 118. The first conductive layer 126a comprises a first group of conductive lines of the plurality of conductive lines 124, the second conductive layer 126b comprises a second group of conductive lines of the plurality of conductive lines 124, the third conductive layer 126c comprises a third group of conductive lines of the plurality of conductive lines 124, the fourth conductive layer 126d comprises a fourth group of conductive lines of the plurality of conductive lines 124, and the fifth conductive layer 126e comprises a fifth group of conductive lines of the plurality of conductive lines 124. The second conductive layer 126b is disposed over the first conductive layer 126a, the third conductive layer 126c is disposed over the second conductive layer 126b, the fourth conductive layer 126d is disposed over the third conductive layer 126c, and the fifth conductive layer 126e is disposed over the fourth conductive layer 126d. It will be appreciated that the plurality of conductive layers 126a-e is not limited to only five conductive layers, but rather the plurality of conductive layers 126a-e may comprise any suitable number of conductive layers.

A first memory cell 128a and a second memory cell 128b are disposed in the ILD structure 118. The first memory cell 128a is spaced from the second memory cell 128b. The first memory cell 128a and the second memory cell 128b are disposed vertically between two neighboring conductive layers of the plurality of conductive layers 126a-c. For example, the first memory cell 128a and the second memory cell 128b are disposed vertically between the third conductive layer 126c and the fourth conductive layer 126d.

The first memory cell 128a and the second memory cell 128b comprise first electrodes 130a-b, respectively. The first memory cell 128a and the second memory cell 128b comprise second electrodes 132a-b, respectively. The first memory cell 128a and the second memory cell 128b comprise data storage structures 134a-b, respectively. The data storage structures 134a-b are disposed vertically between a corresponding one of the first electrodes 130a-b and a corresponding one of the second electrodes 132a-b. For example, the first memory cell 128a comprises a data storage structure 134a disposed between a first electrode 130a and a second electrode 132a, and the second memory cell 128b comprises a data storage structure 134b disposed between a first electrode 130b and a second electrode 132b. The first memory cell 128a is configured to store data (e.g., binary "0" or binary "1") based on a resistive state (e.g., a high resistive state or a low resistive state) of the data storage structure 134a. The second memory cell 128b is configured to store data (e.g., binary "0" or binary "1") based on a resistive state (e.g., a high resistive state or a low resistive state) of the data storage structure 134b.

In some embodiments, the first electrodes 130a-b may be or comprise, for example, a metal (e.g., aluminum (Al), titanium (Ti), tantalum (Ta), gold (Au), platinum (Pt), tungsten (W), nickel (Ni), iridium (Ir), etc.), a metal-nitride (e.g., titanium nitride (TiN), tantalum nitride (TaN), etc.), a metal-oxide (e.g., iridium oxide ($IrO_2$)), doped polysilicon (e.g., n-type/p-type polysilicon), or the like. In some embodiments, the second electrodes 132a-b may be or comprise, for example, a metal (e.g., Al, Ti, Ta, Au, Pt, W, Ni, Ir, etc.), a metal-nitride (e.g., TiN, TaN, etc.), a metal-oxide (e.g., $IrO_2$), doped polysilicon (e.g., n-type/p-type polysilicon), or the like. In further embodiments, the first electrodes 130a-b and the second electrodes 132a-b are or comprise a same material. In other embodiments, the first electrodes 130a-b and the second electrodes 132a-b are or comprise different materials.

In some embodiments, the data storage structures 134a-b are or comprise, for example, a chalcogenide (e.g., germanium-antimony-tellurium (GST)), a ferroelectric crystal material (e.g., lead zirconate titanate (PZT)), a metal-oxide (e.g., hafnium oxide ($Hf_XO_Y$), zirconium-oxide ($Hf_XZr_YO_Z$), etc.), a component-metal-oxide (e.g., hafnium-silicon-oxide ($Hf_XSi_YO_Z$), hafnium-aluminum-oxide ($Hf_XAl_YO_Z$), strontium titanate (STO), etc.), a metal-oxynitride (e.g., hafnium oxynitride ($Hf_XO_YN_Z$)), or some other material that may selectively change between a high resistive state and a low resistive state. In further embodiments, the data storage structures 134a-b may be a magnetic tunnel junction (MTJ). In such embodiments, the MTJ comprises at least two magnetic layers (e.g., ferromagnetic layers) separated by an insulating tunnel barrier. In further such embodiments, the magnetic layers may be or comprise, for example, cobalt (Co), iron (Fe), boron (B), nickel (Ni), ruthenium (Ru), iridium (Ir), platinum (Pt), or the like, and the insulating tunnel barrier layer may be or comprise, for example, magnesium oxide (MgO), aluminum oxide ($Al_2O_3$), or the like.

The first electrode 130a of the first memory cell 128a is electrically coupled to the first source/drain region 106a and to a third bit line 124$bl_3$. The first electrode 130a of the first memory cell 128a is electrically coupled to the first source/drain region 106a via a first conductive path. For example, the first conductive path is defined by a first conductive line of the one or more conductive lines of the third conductive layer 126c (e.g., the third group of conductive lines of the plurality of conductive lines 124), a first conductive via of the plurality of conductive vias 122, a first conductive line of the one or more conductive lines of the second conductive layer 126b (e.g., the second group of conductive lines of the plurality of conductive lines 124), a second conductive via of the plurality of conductive vias 122, a first conductive line of the one or more conductive lines of the first conductive layer 126a (e.g., the first group of conductive lines of the plurality of conductive lines 124), and a first conductive contact of the plurality of conductive contacts 120.

The first electrode 130a of the first memory cell 128a is electrically coupled to the first conductive line of the one or more conductive lines of the third conductive layer 126c. In some embodiments, the first electrode 130a of the first memory cell 128a (directly) contacts the first conductive line of the one or more conductive lines of the third conductive layer 126c. The first conductive via of the plurality of conductive vias 122 electrically couples the first conductive line of the one or more conductive lines of the third conductive layer 126c to the first conductive line of the one or more conductive lines of the second conductive layer 126b. In some embodiments, the first conductive line of the one or more conductive lines of the second conductive layer 126b is the third bit line 124$bl_3$. The second conductive via of the plurality of conductive vias 122 electrically couples the third bit line 124$bl_3$ to the first conductive line of the one or more conductive lines of the first conductive layer 126a. The first conductive contact of the plurality of conductive contacts 120 electrically couples the first conductive line of the one or more conductive lines of the first conductive layer 126a to the first source/drain region 106a.

The second electrode 132a of the first memory cell 128a is electrically coupled to a fourth bit line 124$bl_4$. In some embodiments, a first conductive line of the one or more conductive lines of the fourth conductive layer 126d (e.g., the fourth group of conductive lines of the plurality of conductive lines 124) is the fourth bit line 124$bl_4$. In further embodiments, the second electrode 132a of the first memory cell 128a (directly) contacts the fourth bit line 124$bl_4$. It will be appreciated that the second electrode 132a of the first memory cell 128a may be electrically coupled to the fourth bit line 124$bl_4$ via some other conductive path that is defined by one or more of the plurality of conductive lines 124 and/or one or more of the plurality of conductive vias 122.

The first electrode 130b of the second memory cell 128b is electrically coupled to the second source/drain region 106b and a second bit line 124$bl_2$. The first electrode 130b of the second memory cell 128b is electrically coupled to the second source/drain region 106b via a second conductive path. For example, the second conductive path is defined by a second conductive line of the one or more conductive lines of the third conductive layer 126c, a third conductive via of the plurality of conductive vias 122, a second conductive line of the one or more conductive lines of the second conductive layer 126b, a fourth conductive via of the plurality of conductive vias 122, a second conductive line of the one or more conductive lines of the first conductive layer 126a, and a second conductive contact of the plurality of conductive contacts 120.

The first electrode 130b of the second memory cell 128b is electrically coupled to the second conductive line of the one or more conductive lines of the third conductive layer 126c. In some embodiments, the second conductive line of the one or more conductive lines of the third conductive layer 126c is the second bit line 124$bl_2$. In further embodiments, the first electrode 130b of the second memory cell 128b (directly) contacts the second bit line 124$bl_2$.

The third conductive via of the plurality of conductive vias 122 electrically couples the second bit line 124$bl_2$ to the second conductive line of the one or more conductive lines of the second conductive layer 126b. The fourth conductive via of the plurality of conductive vias 122 electrically couples the second conductive line of the one or more conductive lines of the second conductive layer 126b to the second conductive line of the one or more conductive lines of the first conductive layer 126a. The second conductive contact of the plurality of conductive contacts 120 electrically couples the second conductive line of the one or more conductive lines of the first conductive layer 126a to the second source/drain region 106b.

The second electrode 132b of the second memory cell 128b is electrically coupled to a first bit line 124$bl_1$. In some embodiments, a first conductive line of the one or more conductive lines of the fifth conductive layer 126e (e.g., the fifth group of conductive lines of the plurality of conductive lines 124) is the first bit line 124$bl_1$. The second electrode 132b of the second memory cell 128b is electrically coupled to the first bit line 124$bl_1$ via a third conductive path. For example, the third conductive path is defined by a second conductive line of the one or more conductive lines of the fourth conductive layer 126d and a fifth conductive via of the plurality of conductive vias 122.

The second electrode 132b of the second memory cell 128b is electrically coupled to the second conductive line of the one or more conductive lines of the fourth conductive layer 126d. In some embodiments, the second electrode 132b of the second memory cell 128b (directly) contacts the second conductive line of the one or more conductive lines of the fourth conductive layer 126d. The fifth conductive via of the plurality of conductive vias 122 electrically couples the second conductive line of the one or more conductive lines of the fourth conductive layer 126d to the first bit line 124$bl_1$. The first conductive path, the second conductive path, and the third conductive path (and the other conductive path that may electrically couple the second electrode 132a of the first memory cell 128a to the fourth bit line) are spaced from one another. In other words, the conductive features (e.g., conductive lines, conductive vias, conductive contacts, etc.) that define the first conductive path are spaced from the conductive features that define the second conductive path and the conductive features that define the third conductive path (and the conductive features that define the other conductive path), the conductive features that define the second conductive path are spaced from the conductive features that define the first conductive path and the conductive features that define the third conductive path, and so forth.

The conductive gate electrode 110 of the semiconductor device 104 is electrically coupled to a word line 124wl. In some embodiments, a third conductive line of the one or more conductive lines of the first conductive layer 126a is the word line 124wl. The conductive gate electrode 110 is electrically coupled to the word line 124wl via a fourth conductive path. For example, the fourth conductive path is defined by a sixth conductive via of the plurality of conductive vias 122. The sixth conductive via of the plurality of conductive vias 122 electrically couples the conductive gate electrode 110 to the word line 124*wl*.

As shown in the layout view 100*b* of FIG. 1B, the first memory cell 128*a* and the second memory cell 128*b* are disposed within a cell area (e.g., within a perimeter of the cell area). In some embodiments, the cell area is equal to the square of a distance 136 multiplied by four. In further embodiments, the cell area is a minimum size (e.g., area) of the semiconductor device 104. In some embodiments, the distance 136 is a minimum feature size (e.g., F) of the memory device. For example, in some embodiments, the cell area is equal to $4F^2$, where F is a minimum feature size. In some embodiments, the distance 136 may be between about 0.01 micrometers (μm) and about 0.9 μm. In other embodiments, a width of the cell area (e.g., the distance 136 in a first direction) is different than a length of the cell area (e.g., a different distance in a second direction perpendicular to the first direction). In such embodiments, the cell area is equal to $4(W \times L)^2$, where W is the width of the cell area and L is the length of the cell area. In further such embodiments, the width of the cell area may be between about 0.1 μm and about 0.9 μm, and the length of the cell area may be between about 0.01 μm and about 0.3 μm.

A typical memory device only comprises a single memory cell disposed within the cell area (e.g., only one memory cell disposed within the perimeter of the cell area). Because both the first memory cell 128*a* and the second memory cell 128*b* are disposed within the cell area, the memory device of the present application has a greater cell density (e.g., number of memory cells per unit area) than the typical memory device. Both the first memory cell 128*a* and the second memory cell 128*b* may be disposed within the cell area due to, at least partially, the first memory cell 128*a* being electrically coupled to the first source/drain region 106*a* and the second memory cell 128*b* being electrically coupled to the second source/drain region 106*b*. More specifically, because the first memory cell 128*a* is electrically coupled to the first source/drain region 106*a* and the second memory cell 128*b* is electrically coupled to the second source/drain region 106*b*, the first memory cell 128*a* and the second memory cell 128*b* may be disposed nearer one another (e.g., within the cell area).

Figure 2A:
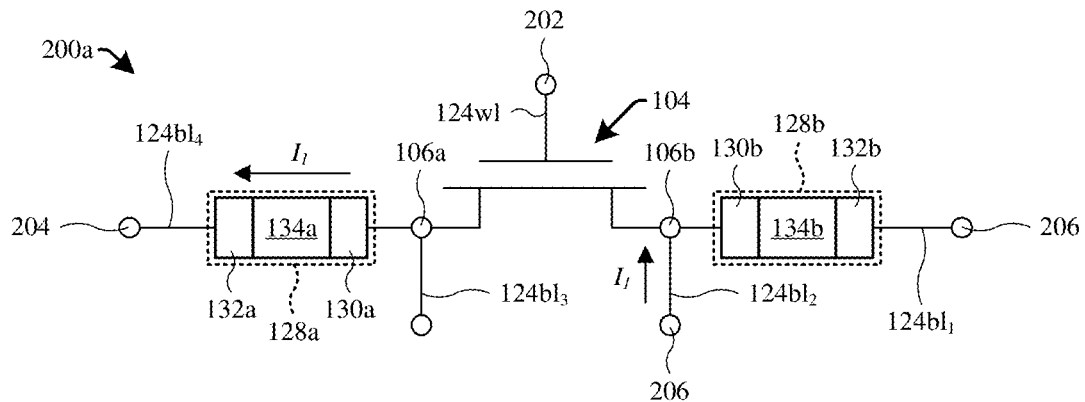
FIGS. 2A-2B illustrate various circuit diagrams of equivalent circuits of some embodiments of the memory device of FIGS. 1A-1B.
Figure 2B:
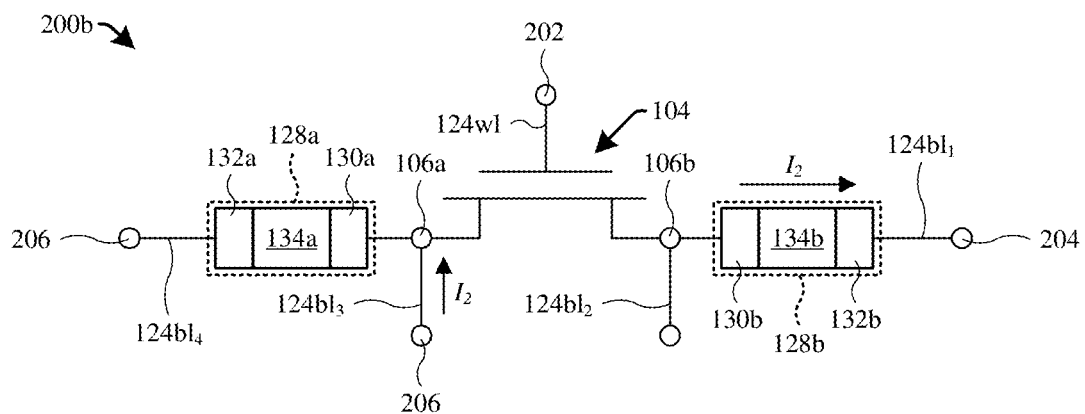

FIGS. 2A-2B illustrate various circuit diagrams 200*a-b* of equivalent circuits of some embodiments of the memory device of FIGS. 1A-1B. The circuit diagram 200*a* of FIG. 2A illustrates operating the first memory cell 128*a* (e.g., the memory operation rule for operating the first memory cell) of some embodiments of the memory device of FIGS. 1A-1B. The circuit diagram 200*b* of FIG. 2B illustrates operating the second memory cell 128*b* (e.g., the memory operation rule for operating the second memory cell) of some embodiments of the memory device of FIGS. 1A-1B.

As shown in the circuit diagram 200*a* of FIG. 2A, to operate the first memory cell 128*a* (e.g., write, erase, or read the first memory cell 128*a*), a first current $I_1$ is passed through the first memory cell 128*a*. To pass the first current $I_1$ through the first memory cell 128*a* a first voltage 202 is applied to the conductive gate electrode 110 of the semiconductor device 104. In some embodiments, the first voltage 202 is referred to as a gate voltage (e.g., VG). The first voltage 202 is applied to the conductive gate electrode 110 of the semiconductor device 104 via the word line 124*wl*. By applying the first voltage 202 to the conductive gate electrode 110 of the semiconductor device 104, the semiconductor device 104 is placed in an "ON" state (e.g., a state in which a conductive channel exists between the first source/drain region 106*a* and the second source/drain region 106*b*). In some embodiments, the semiconductor device 104 is placed in the "ON" state due to the first voltage being above a threshold voltage (e.g., $V_{th}$) of the semiconductor device 104. In some embodiments, the first voltage 202 is between about 0.2 volts (V) and about 4 V. In further embodiments, the threshold voltage of the semiconductor device 104 is between about 0.2 V and about 0.7 V.

Further, a second voltage 204 (e.g., $V_{DD}$) is applied to the second electrode 132*a* of the first memory cell 128*a*. The second voltage 204 is applied to the second electrode 132*a* of the first memory cell 128*a* via the fourth bit line 124*bl*$_4$. In some embodiments, the second voltage 204 is between about −2 V and about 2 V.

The magnitude and polarity of the second voltage 204 is dependent on the specific operation that is being performed on the first memory cell 128*a*. For example, the second voltage 204 is within a first voltage range during a write operation (e.g., SET), a second voltage range during an erase operation (e.g., RESET), and a third voltage range during a read operation. In some embodiments, the first voltage range is between about 0 V and about 2 V. In some embodiments, the second voltage range is between about 0 V and about −2V. In some embodiments, the third voltage range is between about 0.1 V and about 0.3 V.

The write operation (e.g., SET) switches the data storage structure 134*a* from a high resistance state (e.g., binary "1") to a low resistance state (e.g., binary "0"), or vice versa. The erase operation switches the data storage structure 134*a* from the low resistance state to the high resistance state, or vice versa. The read operation probes the first memory cell 128*a* to determine the data storage state (e.g., binary "1" or binary "0") of the data storage structure 134*a*.

Moreover, a third voltage 206 is applied to the second source/drain region 106*b* of the semiconductor device 104 and to the first electrode 130*b* of the second memory cell 128*b*. The third voltage 206 is applied to the second source/drain region 106*b* and to the first electrode 130*b* via the second bit line 124*bl*$_2$. Also, the third voltage 206 is applied to the second electrode 132*b* of the second memory cell 128*b*. The third voltage 206 is applied to the second electrode 132*b* of the second memory cell 128*b* via the first bit line 124*bl*$_1$. The third voltage 206 is ground (e.g., 0 V). In addition, the first source/drain region 106*a* of the semiconductor device 104 and the first electrode 130*a* of the first memory cell 128*a* are left floating (e.g., neither are driven to a specific voltage via the third bit line 124*bl*$_3$). As such, the first current $I_1$ passes through the first memory cell 128*a* from the second bit line 124*bl*$_2$ to the fourth bit line 124*bl*$_4$.

As shown in the circuit diagram 200*b* of FIG. 2B, to operate the second memory cell 128*b* (e.g., write, erase, or read the second memory cell 128*b*), a second current $I_2$ is passed through the second memory cell 128*b*. The second current $I_2$ passes through the second memory cell 128*b* from the third bit line 124*bl*$_3$ to the first bit line 124*bl*$_1$. To pass the second current $I_2$ through the second memory cell 128*b* from the third bit line 124*bl*$_3$ to the first bit line 124*bl*$_1$, the first voltage 202 is applied to the conductive gate electrode 110 of the semiconductor device 104 via the word line 124*wl*. Further, the second voltage 204 is applied to the second electrode 132*b* of the second memory cell 128*b* via the first bit line 124*bl*$_1$. Moreover, the third voltage 206 is applied to the first source/drain region 106*a* of the semiconductor device 104 and to the first electrode 130*a* of the first memory cell 128*a* via the third bit line 124*bl*$_3$. Also, the third voltage 206 is applied to the second electrode 132a of the first memory cell 128a via the fourth bit line 124bl$_4$. In addition, the second source/drain region 106b of the semiconductor device 104 and the first electrode 130b of the second memory cell 128b are left floating (e.g., neither are driven to a specific voltage via the second bit line 124bl$_2$). As such, the second current I$_2$ passes through the second memory cell 128b from the third bit line 124bl$_3$ to the first bit line 124bl$_1$.

Figure 3:
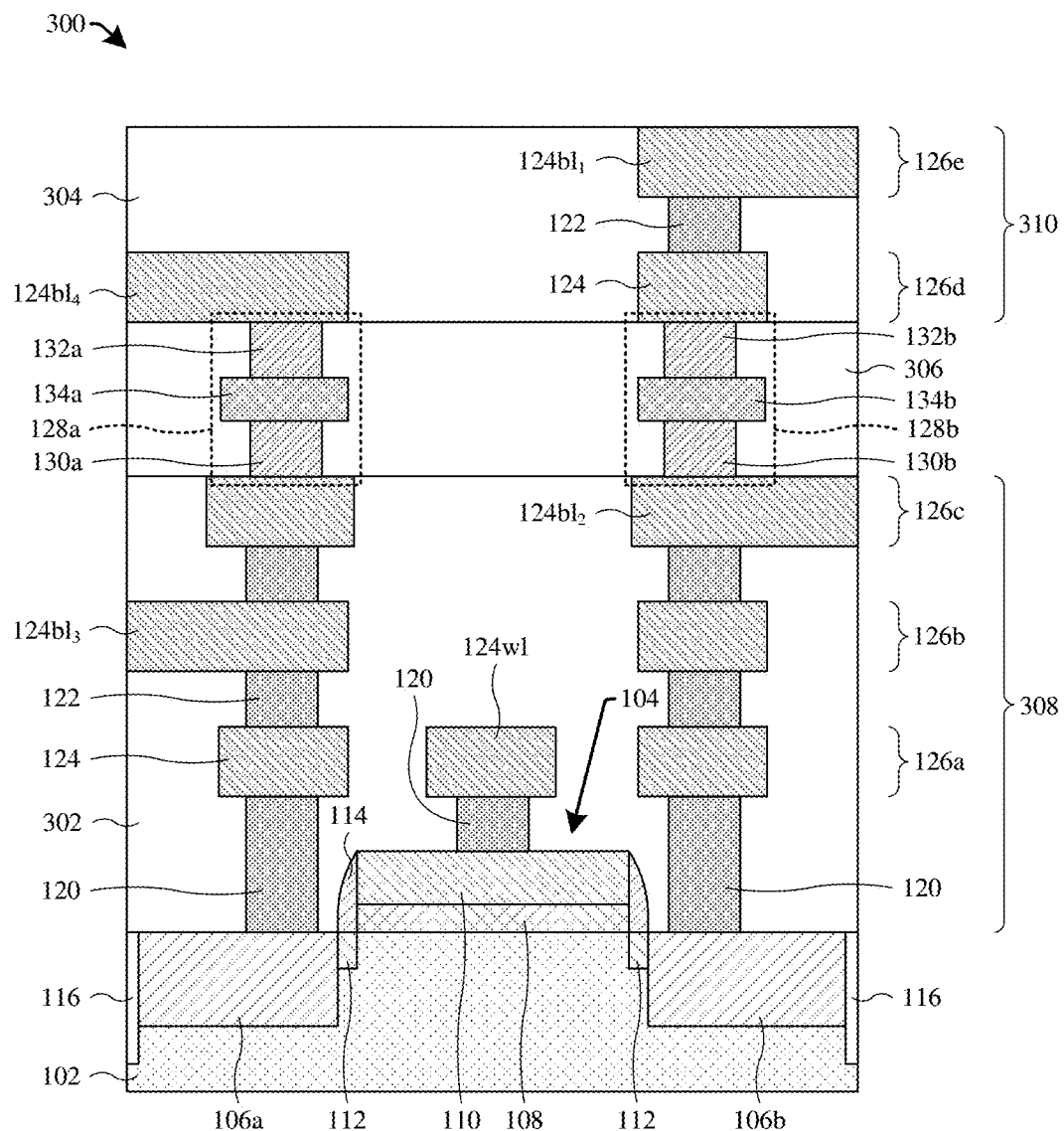
FIG. 3 illustrates a cross-sectional view of some other embodiments of the memory device of FIGS. 1A-1B.

FIG. 3 illustrates a cross-sectional view 300 of some other embodiments of the memory device of FIGS. 1A-1B.

As shown in the cross-sectional view 300 of FIG. 3, a lower ILD structure 302 is disposed over the substrate 102 and the semiconductor device 104. An upper ILD structure 304 is disposed over the lower ILD structure 302. A middle ILD structure 306 is disposed vertically between the upper ILD structure 304 and the lower ILD structure 302. The lower ILD structure 302, the middle ILD structure 306, and the upper ILD structure 304 may comprise one or more stacked ILD layers, which may respectively comprise a low-k dielectric (e.g., a dielectric material with a dielectric constant less than about 3.9), an oxide (e.g., SiO$_2$), or the like.

The plurality of conductive contacts 120; the conductive lines 124 of the first conductive layer 126a, the second conductive layer 126b, and the third conductive layer 126c are disposed within the lower ILD structure 302; the conductive vias 122 that extend between the first conductive layer 126a and the second conductive layer 126b; and the conductive vias 122 that extend between the second conductive layer 126b and the third conductive layer 126c are disposed within the lower ILD structure 302. In some embodiments, the plurality of conductive contacts 120; the conductive lines 124 of the first conductive layer 126a, the second conductive layer 126b, and the third conductive layer 126c; the conductive vias 122 that extend between the first conductive layer 126a and the second conductive layer 126b; and the conductive vias 122 that extend between the second conductive layer 126b and the third conductive layer 126c are referred to as a lower interconnect structure 308.

The conductive lines 124 of the fourth conductive layer 126d; the conductive lines 124 of the fifth conductive layer 126e; and the conductive vias 122 that extend between the fourth conductive layer 126d and the fifth conductive layer 126e are disposed in the upper ILD structure 304. In some embodiments, conductive lines 124 of the fourth conductive layer 126d; the conductive lines 124 of the fifth conductive layer 126e; and the conductive vias 122 that extend between the fourth conductive layer 126d and the fifth conductive layer 126e are referred to as an upper interconnect structure 310.

In some embodiments, each of the conductive lines 124 of each of the conductive layers 126 has an electrical resistance of about 0.5 ohms (Ω). In further embodiments, each of the conductive vias 122 that extend between two corresponding conductive layers have an electrical resistance of about 0.5Ω. For example, the second electrode 132b of the second memory cell 128b is electrically coupled to the first bit line 124bl$_1$ via the third conductive path. In some embodiments, the third conductive path is defined by the second conductive line of the one or more conductive lines of the fourth conductive layer 126d and the fifth conductive via of the plurality of conductive vias 122. As such, the third conductive path has an electrical resistance of about 1Ω (e.g., the second conductive line of the one or more conductive lines of the fourth conductive layer 126d has a first electrical resistance of about 0.5Ω and the fifth conductive via of the plurality of conductive vias 122 has a second electrical resistance of about 0.5Ω).

The first memory cell 128a and the second memory cell 128b are disposed within the middle ILD structure 306. The middle ILD structure 306 laterally surrounds the first memory cell 128a and the second memory cell 128b. The first memory cell 128a and the second memory cell 128b are both disposed vertically between the lower interconnect structure 308 and the upper interconnect structure 310. In some embodiments, the first memory cell 128a has an electrical resistance between about 1,000Ω and about 10,000Ω. In further embodiments, the second memory device 128b has an electrical resistance between about 1,000Ω and about 10,000Ω.

Figure 4:
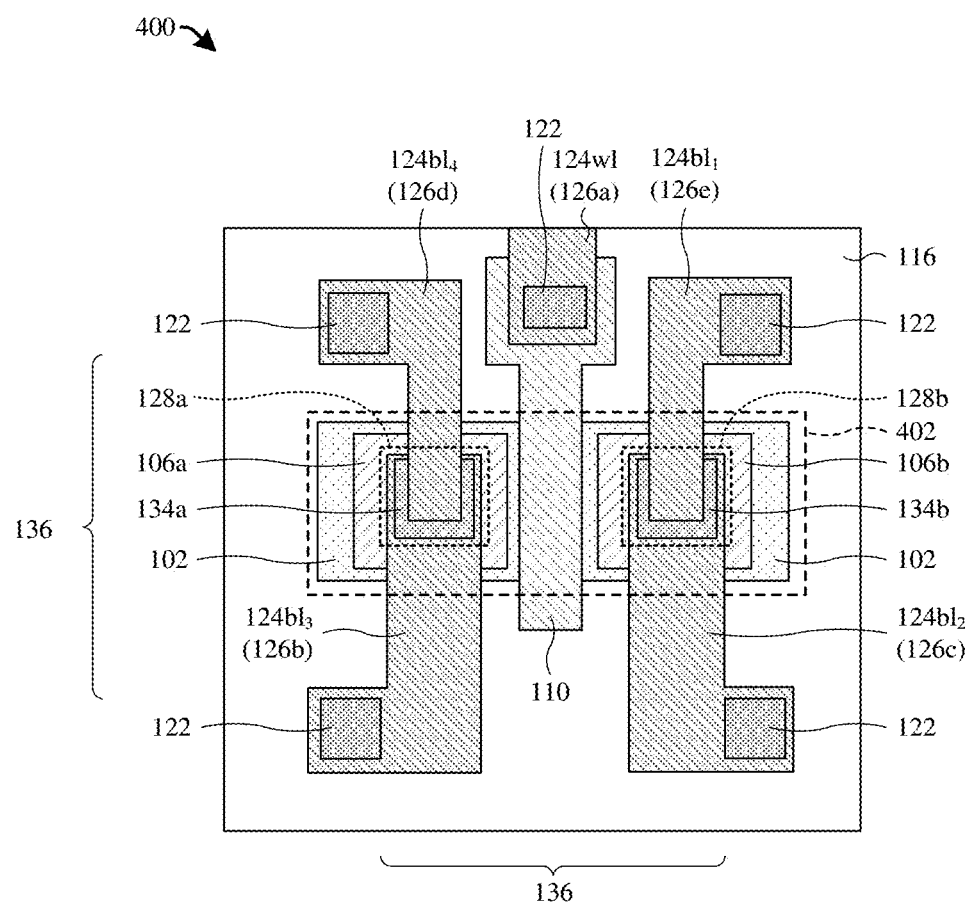
FIG. 4 illustrates a layout view of some other embodiments of the memory device of FIGS. 1A-1B.

FIG. 4 illustrates a layout view 400 of some other embodiments of the memory device of FIGS. 1A-1B.

As shown in the layout view 400 of FIG. 4, the word line 124wl is disposed in the first conductive layer 126a. The third bit line 124bl$_3$ is disposed in the second conductive layer 126b. The second bit line 124bl$_2$ is disposed in the third conductive layer 126c. The fourth bit line 124bl$_4$ is disposed in the fourth conductive layer 126d. The first bit line 124bl$_1$ is disposed in the fifth conductive layer 126e.

Also shown in the layout view 400 of FIG. 4, corresponding conductive vias of the plurality of conductive vias 122 extend (vertically) from the first bit line 124bl$_1$, the second bit line 124bl$_2$, the third bit line 124bl$_3$, the fourth bit line 124bl$_4$, and the word line 124wl. Each of the corresponding conductive vias of the plurality of conductive vias 122 extend vertically from a first corresponding conductive layer of the plurality of conductive layers 126a-e to a second corresponding conductive layer (not shown) of the plurality of conductive layers 126a-e that overlies the first corresponding conductive layer. For example, a first corresponding conductive via of the plurality of conductive vias 122 extends vertically from the third bit line 124bl$_3$ (which is in the second conductive layer 126b) to the first conductive line of the one or more conductive lines of the third conductive layer 126c (e.g., the third group of conductive lines of the plurality of conductive lines 124). It will be appreciated that, in some embodiments, a second corresponding conductive via of the plurality of conductive vias 122 extends vertically from the first bit line 124bl$_1$ (which is in the fifth conductive layer 126e) to a conductive line of the one or more conductive lines of a sixth conductive layer (not shown), which overlies the fifth conductive layer 126c.

In some embodiments, each of the corresponding conductive vias of the plurality of conductive vias 122 are disposed outside a perimeter of a device region 402 of the substrate 102. The first source/drain region 106a and the second source/drain region 106b of the semiconductor device 104 are disposed within the device region 402. In some embodiments, the device region 402 is defined by a region of the substrate 102 that is laterally surrounded in a closed loop path by the isolation structure 116.

Figure 5:
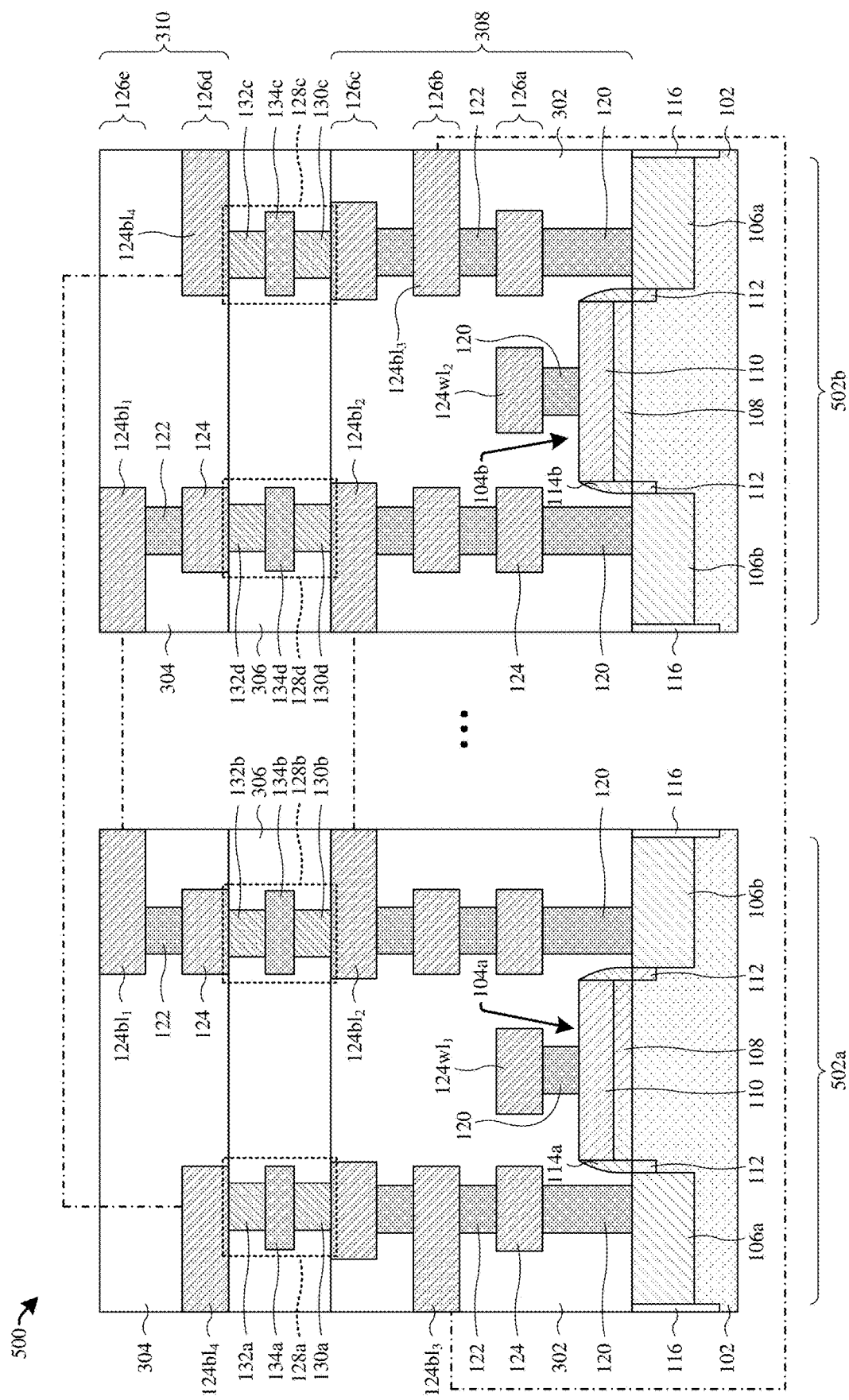
FIG. 5 illustrates a cross-sectional view of some other embodiments of the memory device of FIGS. 1A-1B.

FIG. 5 illustrates a cross-sectional view 500 of some other embodiments of the memory device of FIGS. 1A-1B.

As shown in the cross-sectional view 500 of FIG. 5, the memory device comprises a plurality of memory blocks 502a-b. For example, the plurality of memory blocks 502a-b comprises a first memory block 502a and a second memory block 502b. The first memory block 502a and the second memory block 502b are laterally spaced (illustrated by the ellipsis ( . . . ) of FIG. 5). The first memory block 502a comprises a first semiconductor device 104a, a first memory cell 128a, and a second memory cell 128b. The first memory cell 128a comprises a first electrode 130a, a second electrode 132a, and a data storage structure 134a. The second memory cell 128b comprises a first electrode 130b, a second electrode 132b, and a data storage structure 134b.

A first word line 124$wl_1$ is disposed in a lower ILD structure 302 and electrically coupled to a conductive gate electrode 110 of the first semiconductor device 104a. The first electrode 130a of the first memory cell 128a is electrically coupled to a first source/drain region 106a of the first semiconductor device 104a and to a third bit line 124$bl_3$. The second electrode 132a of the first memory cell 128a is electrically coupled to a fourth bit line 124$bl_4$. The first electrode 130b of the second memory cell 128b is electrically coupled to a second source/drain region 106b of the first semiconductor device 104a and to a second bit line 124$bl_2$. The second electrode 132b of the second memory cell 128b is electrically coupled to a first bit line 124$bl_1$.

The second memory block 502b comprises a second semiconductor device 104b, a third memory cell 128c, and a fourth memory cell 128d. The third memory cell 128c comprises a first electrode 130c, a second electrode 132c, and a data storage structure 134c. The fourth memory cell 128d comprises a first electrode 130d, a second electrode 132d, and a data storage structure 134d.

A second word line 124$wl_2$ is disposed in the lower ILD structure 302 and electrically coupled to a conductive gate electrode 110 of the second semiconductor device 104b. The first word line 124$wl_1$ is laterally spaced from the second word line 124$wl_2$. The first electrode 130c of the third memory cell 128c is electrically coupled to a first source/drain region 106a of the second semiconductor device 104b and to the third bit line 124$bl_3$ (the dashed lines of FIG. 5 illustrate that commonly labeled bit lines (e.g., the third bit line 124$bl_3$ labeled in both the first memory block 502a and the second memory block 502b) are electrically coupled together). A second electrode 132c of the third memory cell 128c is electrically coupled to the fourth bit line 124$bl_4$. A first electrode 130d of the fourth memory cell 128d is electrically coupled to a second source/drain region 106b of the second semiconductor device 104b and to the second bit line 124$bl_2$. A second electrode 132d of the fourth memory cell 128d is electrically coupled to the first bit line 124$bl_1$.

While the cross-sectional view 500 of FIG. 5 illustrates the memory device comprising two memory blocks (e.g., the first memory block 502a and the second memory block 502b), it will be appreciated that the memory device may comprise any number of memory blocks (e.g., 1, 2, 3, 4, etc.). In some embodiments, the memory blocks are coupled together in a memory array. For example, the memory device may comprise four memory blocks, each of which comprise two memory cells, coupled together in a memory array (e.g., an 8-bit memory array).

Also shown in the cross-sectional view 500 of FIG. 5, a plurality of sidewall spacers 114a-b are disposed over the substrate 102. For example, a first sidewall spacer 114a is disposed over the substrate 102, and a second sidewall spacer 114b is disposed over the substrate 102. The first sidewall spacer 114a is disposed along sidewalls of the conductive gate electrode 110 and the gate dielectric 108 of the first semiconductor device 104a. The second sidewall spacer 114b is disposed along sidewalls of the conductive gate electrode 110 and the gate dielectric 108 of the second semiconductor device 104b.

Figures 6A, 6B:
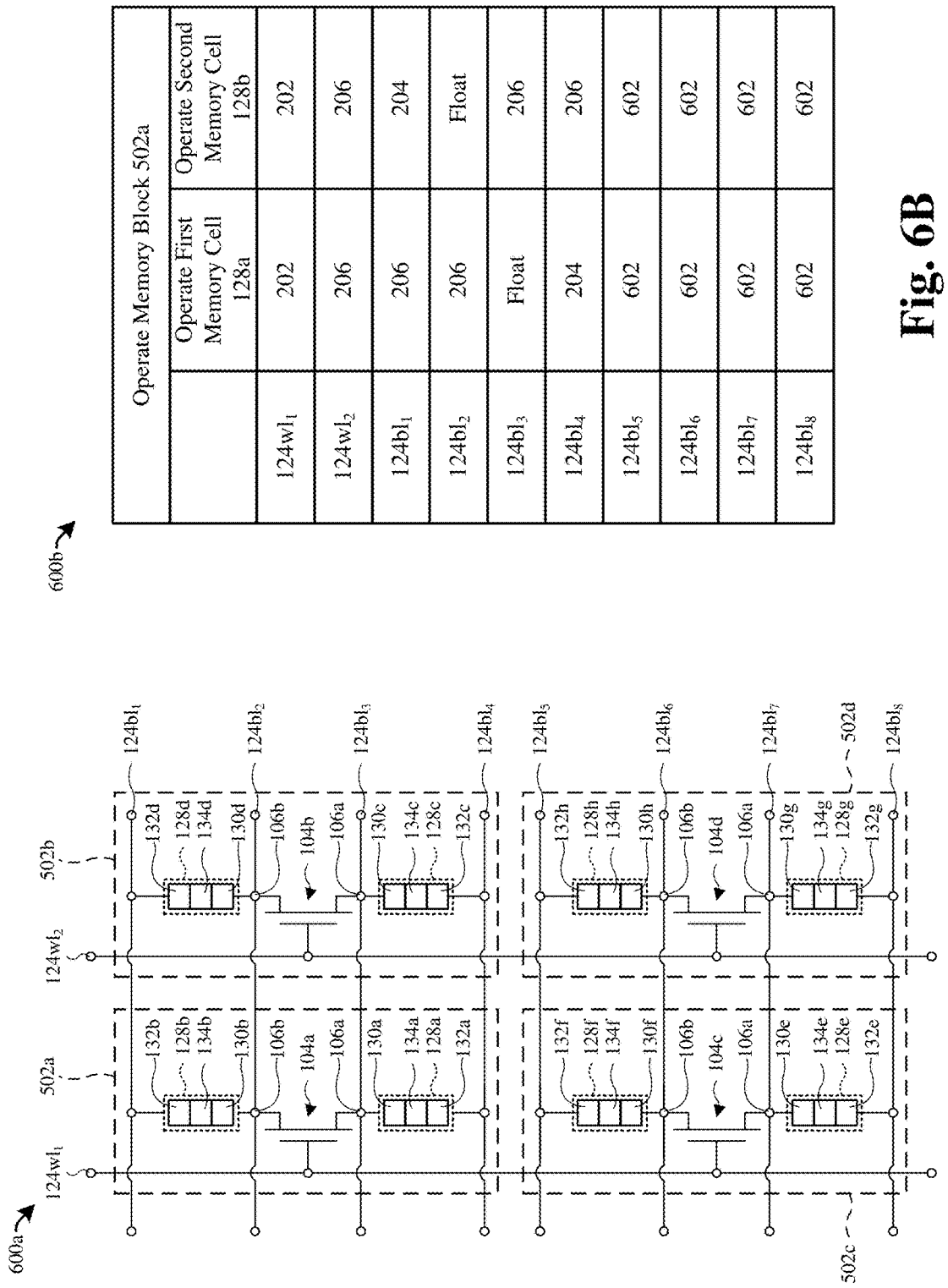
FIG. 6A illustrates a circuit diagram of an equivalent circuit of some embodiments of the memory device of FIGS. 1A-1B.
FIG. 6B illustrates a table of some embodiments of operating a first memory block of the equivalent circuit of the circuit diagram of FIG. 6A.

FIG. 6A illustrates a circuit diagram 600a of an equivalent circuit of some embodiments of the memory device of FIGS. 1A-1B. More specifically, the equivalent circuit of the circuit diagram 600a illustrates the memory device of FIGS. 1A-1B in which the memory device comprises an 8-bit memory array. FIG. 6B illustrates a table 600b of some embodiments of operating a first memory block 502a of the equivalent circuit of the circuit diagram 600a of FIG. 6A.

As shown in the circuit diagram 600a of FIG. 6A, the memory device comprises a plurality of memory blocks 502a-d. For example, the plurality of memory blocks 502a-d comprises a first memory block 502a, a second memory block 502b, a third memory block 502c, and a fourth memory block 502d. While the circuit diagram 600a of FIG. 6A illustrates the plurality of memory blocks 502a-d comprising four separate memory blocks, it will be appreciated that the plurality of memory blocks 502a-d may comprise any number of memory blocks.

The plurality of memory blocks 502a-d comprises a plurality of semiconductor devices 104a-d, respectively. Each of the plurality of memory blocks 502a-d also comprises two corresponding memory cells of a plurality of memory cells 128a-h. For example, the first memory block 502a comprises a first semiconductor device 104a, a first memory cell 128a, and a second memory cell 128b; the second memory block 502b comprises a second semiconductor device 104b, a third memory cell 128c, and a fourth memory cell 128d; the third memory block 502c comprises a third semiconductor device 104c, a fifth memory cell 128e, and a sixth memory cell 128f; and the fourth memory block 502d comprises a fourth semiconductor device 104d, a seventh memory cell 128g, and an eighth memory cell 128h.

The plurality of memory cells 128a-h comprise a plurality of first electrodes 130a-h, respectively. The plurality of memory cells 128a-h comprise a plurality of second electrodes 132a-h, respectively. The plurality of memory cells 128a-h comprise a plurality of data storage structures 134a-h, respectively. For example, the first memory cell 128a comprises a first electrode 130a, a second electrode 132a, and a data storage structure 134a; the second memory cell 128b comprises a first electrode 130b, a second electrode 132b, and a data storage structure 134b; the third memory cell 128c comprises a first electrode 130c, a second electrode 132c, and a data storage structure 134c; and so forth.

A plurality of word lines 124$wl_{1-2}$ are electrically coupled to the plurality of semiconductor devices 104a-d. More specifically, a first word line 124$wl_1$ is electrically coupled to a conductive gate electrode of the first semiconductor device 104a and a conductive gate electrode of the third semiconductor device 104c. A second word line 124$wl_2$ is electrically coupled to a conductive gate electrode of the second semiconductor device 104b and a conductive gate electrode of the fourth semiconductor device 104d.

A plurality of bit lines 124$bl_{1-8}$ are electrically coupled to the plurality of memory cells 128a-h. More specifically, a first bit line 124$bl_1$ is electrically coupled to the second electrode 132b of the second memory cell 128b and the second electrode 132d of the fourth memory cell 128d. A second bit line 124$bl_2$ is electrically coupled to the first electrode 130b of the second memory cell 128b and the first electrode 130d of the fourth memory cell 128d. A third bit line 124$bl_3$ is electrically coupled to the first electrode 130a of the first memory cell 128a and the first electrode 130c of the third memory cell 128c. A fourth bit line 124$bl_4$ is electrically coupled to the second electrode 132a of the first memory cell 128a and the second electrode 132d of the third memory cell 128c.

A fifth bit line 124$bl_5$ is electrically coupled to the second electrode 132f of the sixth memory cell 128f and the second electrode 132h of the eighth memory cell 128h. A sixth bit line 124$bl_6$ is electrically coupled to the first electrode 130f of the sixth memory cell 128f and the first electrode 130h of the eighth memory cell 128h. A seventh bit line 124bl$_7$ is electrically coupled to the first electrode 130e of the fifth memory cell 128e and the first electrode 130g of the seventh memory cell 128g. An eighth bit line 124bl$_5$ is electrically coupled to the second electrode 132e of the fifth memory cell 128e and the second electrode 132g of the seventh memory cell 128g.

As shown in the table 600b of FIG. 6B, specific voltages are applied to the plurality of bit lines 124bl$_{1-8}$ and the plurality of memory cells 128a-h to operate the first memory block 502a (e.g., write, erase, or read the first memory cell 128a and/or the second memory cell 128b).

For example, to operate the first memory cell 128a (e.g., write, erase, or read the first memory cell 128a), a first voltage 202 (see, FIGS. 2A-2B) is applied to the first word line 124wl$_1$, and a third voltage 206 (sec, FIGS. 2A-2B) is applied to the second word line 124wl$_2$. Further, the third voltage 206 is also applied to the first bit line 124bl$_1$ and the second bit line 124bl$_2$. Moreover, a second voltage 204 (see, FIGS. 2A-2B) is applied to the fourth bit line 124bl$_4$, while the third bit line 124bl$_3$ is floating (e.g., not driven to a specific voltage).

In addition, a fourth voltage 602 is applied to the fifth bit line 124bl$_5$, the sixth bit line 124bl$_6$, the seventh bit line 124bl$_7$, and the eighth bit line 124bl$_8$. In some embodiments, the fourth voltage 602 is referred to as a standby voltage (e.g., V$_{STB}$). The plurality of semiconductor devices 104a-d have a threshold voltage (e.g., V$_{TH}$). In some embodiments, the threshold voltage (e.g., V$_{TH}$) of the plurality of semiconductor devices 104a-d is between about 0.2 volts (V) and about 0.7 V. The fourth voltage 602 is less than a difference between the first voltage 202 and the threshold voltage (e.g., V$_{TH}$) of the plurality of semiconductor devices 104a-d. For example, the first voltage 202 may be 4 V and the threshold voltage of the plurality of semiconductor devices 104a-d may be 0.7 V. As such, the fourth voltage 602 is less than 3.3 V. In another example, the first voltage 202 may be 0.2 V and the threshold voltage of the plurality of semiconductor devices 104a-d may be 0.2 V. As such, the fourth voltage 602 is less than 0 V.

It will be appreciated that applying a voltage to one of the plurality of bit lines 124bl$_{1-8}$ applies that voltage to each of the features of the plurality of memory cells 128a-h that are electrically coupled to the one of the plurality of bit lines 124bl$_{1-8}$. For example, by applying the third voltage 206 to the first bit line 124bl$_1$, the third voltage 206 is applied to the second electrode 132b of the second memory cell 128b and to the second electrode 132d of the fourth memory cell 128d. Likewise, it will also be appreciated that applying a voltage to one of the plurality of word lines 124wl$_{1-2}$ applies that voltage to each of the features of the plurality of semiconductor devices 104a-d that are electrically coupled to the one of plurality of word lines 124wl$_{1-2}$. For example, by applying the first voltage 202 to the first word line 124wl$_1$, the first voltage is applied to the conductive gate electrode (see, e.g., FIGS. 1-5) of the first semiconductor device 104a and the conductive gate electrode of the third semiconductor device 104c.

By applying the third voltage 206 (e.g., ground) to the second word line 124wl$_2$, the second semiconductor device 104b and the fourth semiconductor device 104d are in an "OFF" state (e.g., a state in which the conductive channel does not exists between the first source/drain region 106a and the second source/drain region 106b). In some embodiments, the second semiconductor device 104b and the fourth semiconductor device 104d are in an "OFF" state due to the third voltage 206 being below a threshold voltage (e.g., V$_{th}$) of the second semiconductor device 104b and the fourth semiconductor device 104d (e.g., the second semiconductor device 104b and the fourth semiconductor device 104d are operating in their "cut-off" regions). As such, the second memory block 502b and the fourth memory block 502d are in an "OFF" state (e.g., no current flow (not accounting for leakage current)).

By applying the first voltage 202 (e.g., between about 0.2 V and about 4 V) to the first word line 124wl$_1$, and by applying the fourth voltage 602 to the fifth bit line 124bl$_5$, the sixth bit line 124bl$_6$, the seventh bit line 124bl$_7$, and the eighth bit line 124bl$_8$, the third memory block 502c is also in the "OFF" state (e.g., no current flow (not accounting for leakage current)). More specifically, the third memory block 502c is in the "OFF" state due to the first voltage 202 minus the fourth voltage 602 being less than the threshold voltage of the third semiconductor device 104c. As such, the third semiconductor device 104c is also in the "OFF" state.

By floating the third bit line 124bl$_3$, and by applying the first voltage 202 to the first word line 124wl$_1$, the third voltage 206 to the first bit line 124bl$_1$, the third voltage 206 to the second bit line 124bl$_2$, and the second voltage 204 (e.g., between about −2 V and about 2V) to the fourth bit line 124bl$_4$, the first memory cell 128a may be operated (e.g., write, erase, or read the first memory cell 128a). More specifically, by applying these voltages in the above described manner, the first semiconductor device 104a is placed in an "ON" state. Further, a first current (see, I$_1$ of FIG. 2A) passes through the first memory cell 128a from the second bit line 124bl$_2$ to the fourth bit line 124bl$_4$, thereby allowing the first memory cell 128a to be operated. It will be appreciated that the specific magnitude and polarity of the second voltage 204 is dependent on the specific operation (e.g., SET, RESET, read) that is being performed on the first memory cell 128a (see, FIG. 2A).

Also shown in the table 600b of FIG. 6B, to operate the second memory cell 128b (e.g., write, erase, or read the second memory cell 128b), the first voltage 202 is applied to the first word line 124wl$_1$; the third voltage 206 is applied to the second word line 124wl$_2$; the second voltage 204 is applied to the first bit line 124bl$_1$; the second bit line 124bl$_2$ is floated (e.g., electrically floating); the third voltage 206 is applied to the third bit line 124bl$_3$ and the fourth bit line 124bl$_4$; and the fourth voltage 602 is applied to the fifth bit line 124bl$_5$, the sixth bit line 124bl$_6$, the seventh bit line 124bl$_7$, and the eighth bit line 124bl$_8$. As such, the second memory block 502b, the third memory block 502c, and the fourth memory block 502d are in the "OFF" state.

By floating the second bit line 124bl$_2$, and by applying the first voltage 202 to the first word line 124wl$_1$, the second voltage 204 to the first bit line 124bl$_1$, the third voltage 206 to the third bit line 124bl$_3$, and the third voltage 206 to the fourth bit line 124bl$_4$, the second memory cell 128b may be operated (e.g., write, erase, or read the second memory cell 128b). More specifically, by applying these voltages in the above described manner, the first semiconductor device 104a is placed in an "ON" state. Further, a second current (see, I$_2$ of FIG. 2B) passes through the second memory cell 128b from the third bit line 124bl$_3$ to the first bit line 124bl$_1$, thereby allowing the second memory cell 128b to be operated. It will be appreciated that the specific magnitude and polarity of the second voltage 204 is dependent on the specific operation (e.g., SET, RESET, read) that is being performed on the second memory cell 128b (see, FIG. 2B).

It will be appreciated that the second memory block 502b, the third memory block 502c, and the fourth memory block 502d are operated in a substantially similar manner as the first memory block 502a. It will further be appreciated that when operating one of the plurality of memory blocks 502a-d each of the other ones of the plurality of memory blocks 502a-d are to be in the "OFF" state. For example, when operating the second memory block 502b, the first memory block 502a, the third memory block 502c, and the fourth memory block are placed in the "OFF" state.

As discussed above, the memory device of the present application may have a greater cell density (e.g., number of memory cells per unit area) than a typical memory device. In addition, the memory device of the present application may reduce or eliminate block-to-block crosstalk (e.g., cross-talk between the plurality of memory blocks 502a-d). The memory device of the present application reduces (or eliminates) block-to-block crosstalk due to the manner in which the plurality of memory blocks 502a-d are operated. More specifically, the memory device of the present application may reduce (or eliminate) block-to-block crosstalk by operating one of the plurality of memory blocks 502a-d while each of the other ones of the plurality of memory blocks 502a-d are in the OFF state.

Figure 7:
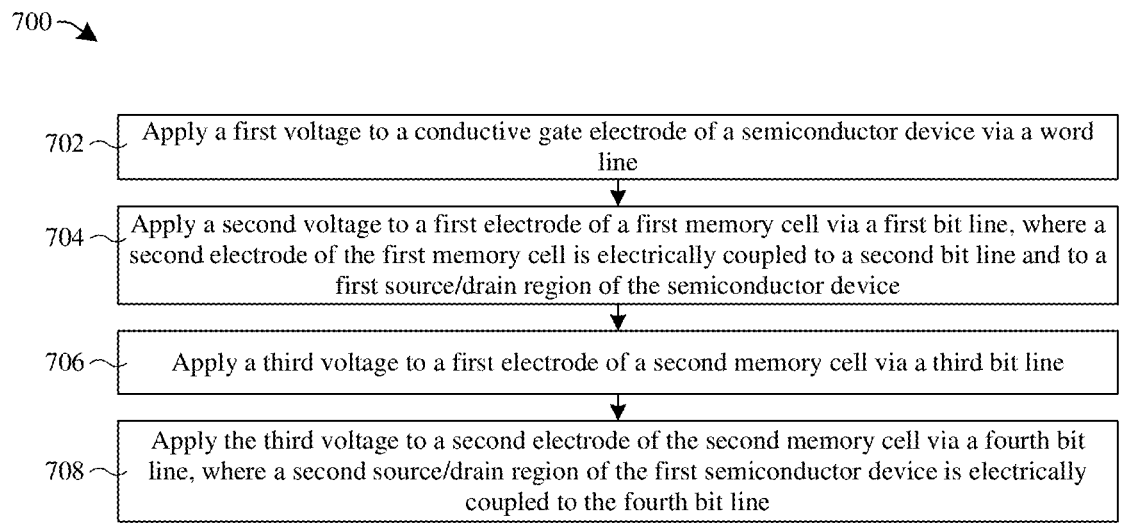
FIG. 7 illustrates a flowchart of some embodiments of a method for operating a memory block of some embodiments of the memory device of FIGS. 1A-1B.

FIG. 7 illustrates a flowchart 700 of some embodiments of a method for operating a memory block of some embodiments of the memory device of FIGS. 1A-1B. While the flowchart 700 of FIG. 7 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 702, a first voltage is applied to a conductive gate electrode of a semiconductor device via a word line (see, e.g., FIG. 2A and FIGS. 6A-6B).

At act 704, a second voltage is applied to a first electrode of a first memory cell via a first bit line, where a second electrode of the first memory cell is electrically coupled to a second bit line and to a first source/drain region of the semiconductor device (sec, e.g., FIG. 2A and FIGS. 6A-6B).

At act 706, a third voltage is applied to a first electrode of a second memory cell via a third bit line (sec, e.g., FIG. 2A and FIGS. 6A-6B).

At act 708, the third voltage is applied to a second electrode of the second memory cell via a fourth bit line, where a second source/drain region of the first semiconductor device is electrically coupled to the fourth bit line (see, e.g., FIG. 2A and FIGS. 6A-6B).

Figure 8:
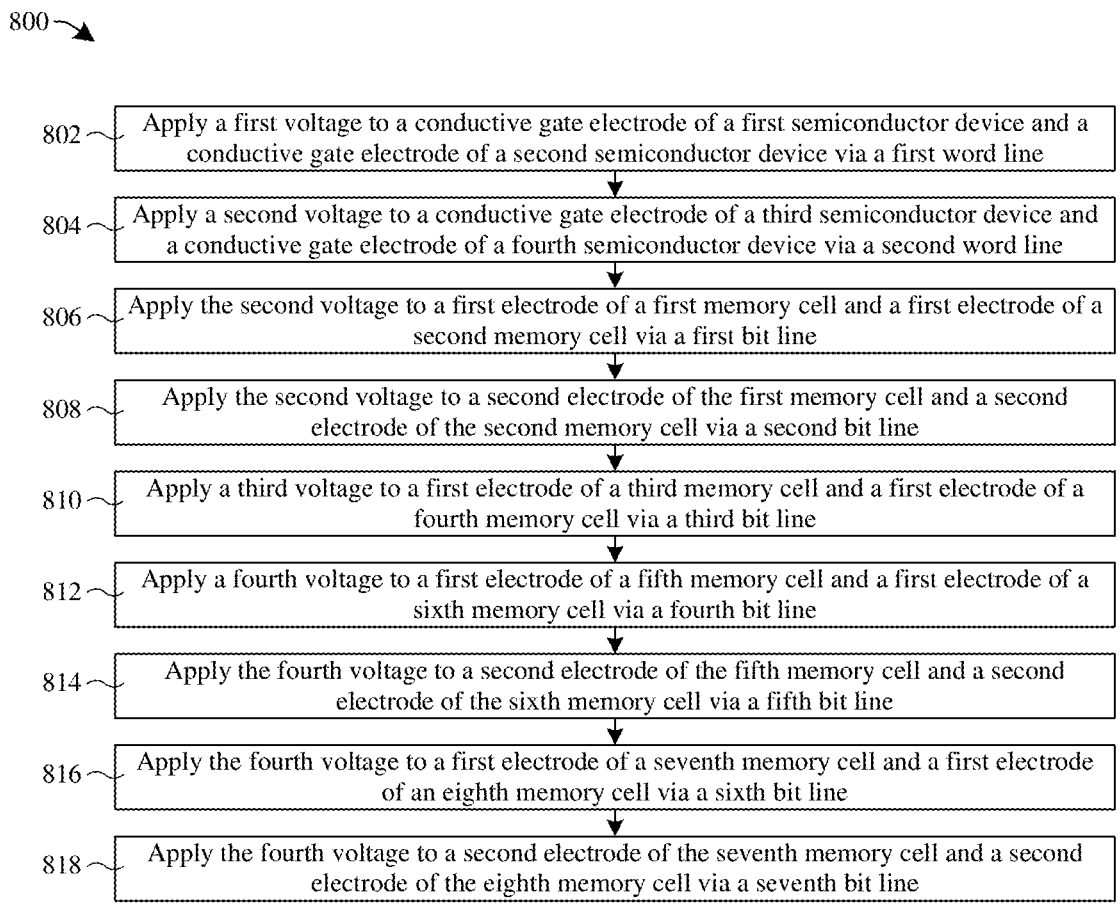
FIG. 8 illustrates a flowchart of some embodiments of a method for operating a memory block of some embodiments of the memory device of FIGS. 1A-1B, where the memory block is one memory block of a plurality of memory blocks.

FIG. 8 illustrates a flowchart 800 of some embodiments of a method for operating a memory block of some embodiments of the memory device of FIGS. 1A-1B, where the memory block is one memory block of a plurality of memory blocks. While the flowchart 800 of FIG. 8 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 802, a first voltage is applied to a conductive gate electrode of a first semiconductor device and a conductive gate electrode of a second semiconductor device via a first word line (see, e.g., FIGS. 6A-6B).

At act 804, a second voltage is applied to a conductive gate electrode of a third semiconductor device and a conductive gate electrode of a fourth semiconductor device via a second word line (see, e.g., FIGS. 6A-6B).

At act 806, the second voltage is applied to a first electrode of a first memory cell and a first electrode of a second memory cell via a first bit line (see, e.g., FIGS. 6A-6B).

At act 808, the second voltage is applied to a second electrode of the first memory cell and a second electrode of the second memory cell via a second bit line (see, e.g., FIGS. 6A-6B).

At act 810, a third voltage is applied to a first electrode of a third memory cell and a first electrode of a fourth memory cell via a third bit line (sec, e.g., FIGS. 6A-6B).

At act 812, a fourth voltage is applied to a first electrode of a fifth memory cell and a first electrode of a sixth memory cell via a fourth bit line (see, e.g., FIGS. 6A-6B).

At act 814, the fourth voltage is applied to a second electrode of the fifth memory cell and a second electrode of the sixth memory cell via a fifth bit line (sec, e.g., FIGS. 6A-6B).

At act 816, the fourth voltage is applied to a first electrode of a seventh memory cell and a first electrode of an eighth memory cell via a sixth bit line (sec, e.g., FIGS. 6A-6B).

At act 818, the fourth voltage is applied to a second electrode of the seventh memory cell and a second electrode of the eighth memory cell via a seventh bit line (see, e.g., FIGS. 6A-6B).

FIGS. 9-12 illustrate a series of cross-sectional views 900-1200 of some embodiments of a method for forming a memory device that has increased memory cell density and reduced crosstalk. Although FIGS. 9-12 are described with reference to a method, it will be appreciated that the structures shown in FIGS. 9-12 are not limited to the method but rather may stand alone separate of the method.

Figure 9:
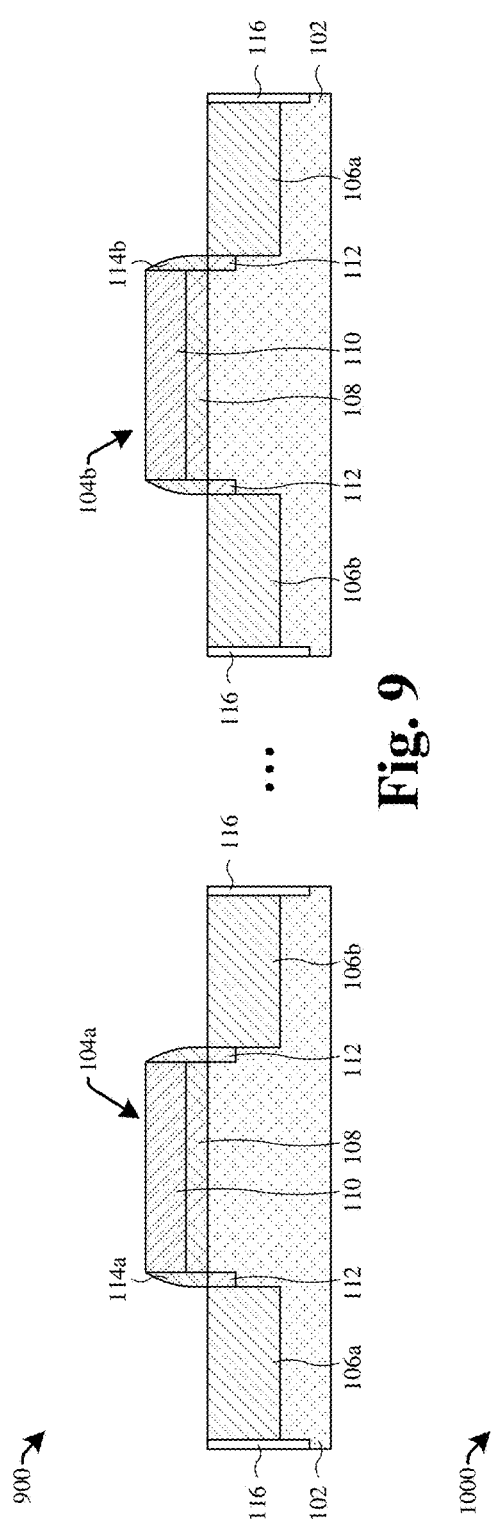
FIGS. 9-12 illustrate a series of cross-sectional views of some embodiments of a method for forming a memory device that has increased memory cell density and reduced crosstalk.

As shown in the cross-sectional view 900 of FIG. 9, an isolation structure 116 is formed in the substrate 102. In some embodiments, a process for forming the isolation structure 116 comprises selectively etching the substrate 102 to form a trench in the substrate 102. The substrate 102 may be selectively etched by forming a patterned masking layer (not shown) (e.g., positive/negative photoresist, a hard mask, etc.) over the substrate 102. The patterned masking layer may be formed by forming a masking layer (not shown) on an upper surface of the substrate 102 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the substrate 102 according to the first patterned masking layer. The etching process removes unmasked portions of the substrate 102, thereby forming the trench in the substrate 102. In some embodiments, the etching process may be, for example, a wet etching process, a dry etching process, a reactive ion etching (RIE) process, some other etching process, or a combination of the foregoing.

Thereafter, the trench is filled with a dielectric material. The dielectric material may be or comprise, for example, an oxide (e.g., $SiO_2$), a nitride (e.g., SiN), an oxy-nitride (e.g., SiON), a carbide (e.g., SiC), some other dielectric material, or a combination of the foregoing. In some embodiments, a process for filing the trench with the dielectric material comprises depositing or growing the dielectric material on the substrate 102 and in the trench. The dielectric material may be deposited or grown by, for example, chemical vapor deposition (CVD), physical vapor deposition (PVD), atomic layer deposition (ALD), thermal oxidation, some other deposition or growth process, or a combination of the foregoing. In some embodiments, a planarization process (e.g., chemical mechanical polishing (CMP)) may be performed on the dielectric material to remove an upper portion of the dielectric material, thereby leaving a lower portion of the dielectric material in the trench as the isolation structure 116.

Also shown in the cross-sectional view 900 of FIG. 9, a plurality of semiconductor devices 104a-b are formed in/over the substrate 102. For example, a first semiconductor device 104a and a second semiconductor device 104b are formed in the substrate 102. The first semiconductor device 104a and the second semiconductor device 104b each comprise a first source/drain region 106a, a second source/drain region 106b, a pair of lightly-doped source/drain extensions 112, a gate dielectric 108, and a conductive gate electrode 110.

In some embodiments, a process for forming the plurality of semiconductor devices 104a-b comprises depositing and/or growing (e.g., by CVD, PVD, ALD, thermal oxidation, etc.) a gate dielectric layer on the substrate 102. Next, a gate electrode layer is deposited (e.g., by CVD, PVD, ALD, sputtering, electrochemical plating, electroless plating, etc.) on the gate dielectric layer. Thereafter, the gate electrode layer is selectively etched to form the conductive gate electrode 110 of the first semiconductor device 104a and the conductive gate electrode 110 of the second semiconductor device 104b, and the gate dielectric layer is selectively etched to form the gate dielectric 108 of the first semiconductor device 104a and the gate dielectric 108 of the second semiconductor device 104b. In some embodiments, the gate electrode layer may comprise, for example, polysilicon, a metal (e.g., Al, Cu, Ti, Ta, W, Mo, Co, etc.). In further embodiments, the gate dielectric layer may comprise, for example, an oxide (e.g., $SiO_2$), a high-k dielectric (e.g., HfO, TaO, HfSiO, HfTaO, AlO, ZrO, etc.), or the like.

Thereafter, the pair of lightly-doped source/drain extensions 112 of the first semiconductor device 104a and the pair of lightly-doped source/drain extensions 112 of the second semiconductor device 104b are formed in the substrate 102. In some embodiments, the pair of lightly-doped source/drain extensions 112 of the first semiconductor device 104a and the pair of lightly-doped source/drain extensions 112 of the second semiconductor device 104b may be formed by a first selective implantation process (e.g., ion implantation, diffusion, etc.) that utilizes a first masking layer (not shown) disposed over the substrate 102 to selectively implant first doping type dopants (e.g., n-type dopants, such as phosphorus, arsenic, antimony, etc.) into the substrate 102. It will be appreciated that, in some embodiments, the conductive gate electrode 110 of the first semiconductor device 104a, the conductive gate electrode 110 of the second semiconductor device 104b, and/or the isolation structure 116 are utilized as the first masking layer.

Thereafter, a plurality of sidewall spacers 114a-b are formed over the substrate 102. For example, a first sidewall spacer 114a and a second sidewall spacer 114b are formed over the substrate 102. The first sidewall spacer 114a is also formed along sidewalls of the conductive gate electrode 110 and the gate dielectric 108 of the first semiconductor device 104a. The second sidewall spacer 114b is also formed along sidewalls of the conductive gate electrode 110 and the gate dielectric 108 of the second semiconductor device 104b.

In some embodiments, a process for forming the plurality of sidewall spacers 114a-b comprises depositing a sidewall spacer layer (not shown) over the substrate 102, over the conductive gate electrode 110 of the first semiconductor device 104a, and over the conductive gate electrode 110 of the second semiconductor device 104b. Thereafter, horizontal portions of the spacer layer are etched away, thereby leaving vertical portions of the spacer layer in place as the plurality of sidewall spacers 114a-b. In some embodiments, the sidewall spacer layer may be or comprise, for example, an oxide (e.g., $SiO_2$), a nitride (e.g., silicon nitride (e.g., SiN)), an oxy-nitride (e.g., silicon oxy-nitride ($SiO_XN_Y$)), some other dielectric material, or a combination of the foregoing.

Thereafter, the pair of source/drain regions 106a-b of the first semiconductor device 104a and the pair of source/drain regions 106a-b of the second semiconductor device 104b are formed in the substrate 102. In some embodiments, the pair of source/drain regions 106a-b of the first semiconductor device 104a and the pair of source/drain regions 106a-b of the second semiconductor device 104b may be formed by a second selective implantation process (e.g., ion implantation, diffusion, etc.) that utilizes a second masking layer (not shown) disposed over the substrate 102 to selectively implant first doping type dopants (e.g., n-type dopants, such as phosphorus, arsenic, antimony, etc.) into the substrate 102. It will be appreciated that, in some embodiments, the plurality of sidewall spacers 114a-b, the conductive gate electrode 110 of the first semiconductor device 104a, the conductive gate electrode 110 of the second semiconductor device 104b, and/or the isolation structure 116 are utilized as the second masking layer.

Figure 10:
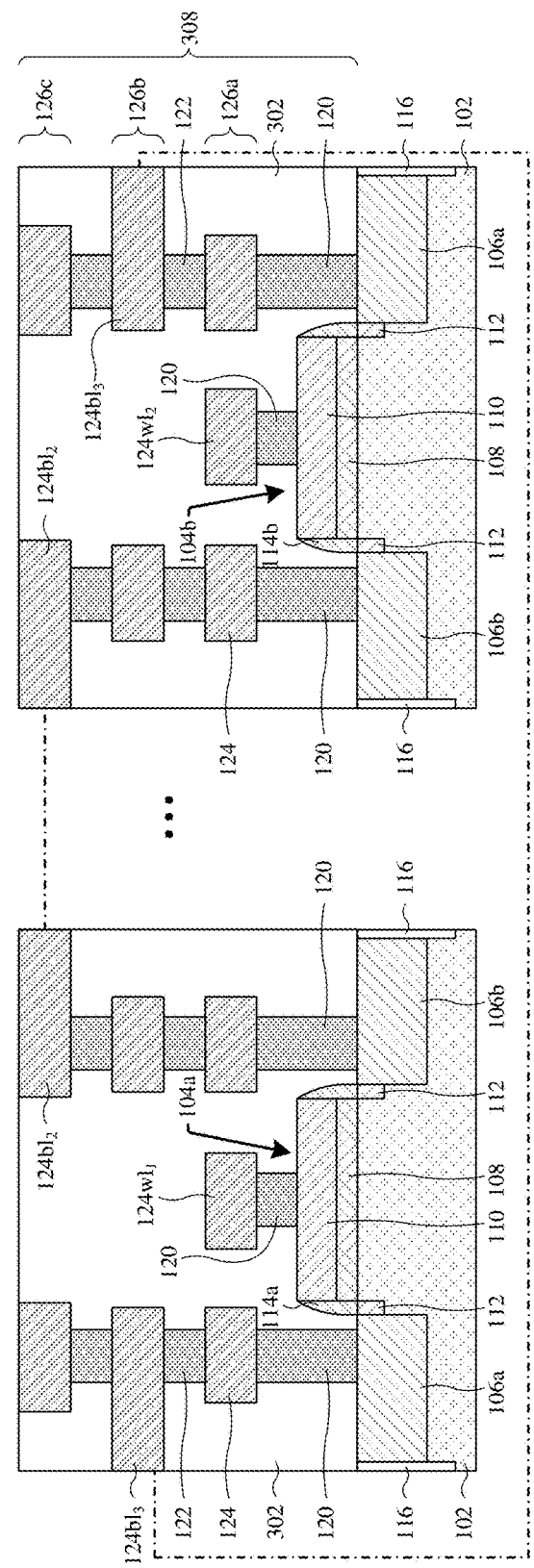

As shown in cross-sectional view 1000 of FIG. 10, a lower interlayer dielectric (ILD) structure 302 is formed over the substrate 102 and the plurality of semiconductor device 104a-b. The lower ILD structure 302 comprise one or more stacked ILD layers. Also shown in the cross-sectional view 1000 of FIG. 10, a lower interconnect structure 308 is formed in the lower ILD structure 302. The lower interconnect structure 308 comprises a plurality of conductive contacts 120, some of a plurality of conductive lines 124, and some of a plurality of conductive vias 122. More specifically, the lower interconnect structure 308 comprises the plurality of conductive contacts 120; the conductive lines 124 of a first conductive layer 126a, a second conductive layer 126b, and a third conductive layer 126c; the conductive vias 122 that extend between the first conductive layer 126a and the second conductive layer 126b; and the conductive vias 122 that extend between the second conductive layer 126b and the third conductive layer 126c.

The lower interconnect structure 308 is formed with a first set of conductive features (e.g., the plurality of conductive contacts 120, the plurality of conductive lines 124, and the plurality of conductive vias 122) that are electrically coupled together and define a first conductive path. The first conductive path is electrically coupled to the first source/drain region 106a of the first semiconductor device 104a. The lower interconnect structure 308 is formed with a second set of conductive features that are electrically coupled together and define a second conductive path. The second conductive path is electrically coupled to the second source/drain region 106b of the first semiconductor device 104a. The first conductive path is different than the second conductive path.

The lower interconnect structure 308 is formed with a third set of conductive features that are electrically coupled together and define a fifth conductive path. The fifth conductive path is electrically coupled to the first source/drain region 106a of the second semiconductor device 104b. The lower interconnect structure 308 is formed with a fourth set of conductive features that are electrically coupled together and define a sixth conductive path. The sixth conductive path is electrically coupled to the second source/drain region 106b of the second semiconductor device 104b. The fifth conductive path is different than the sixth conductive path. In some embodiments, the first conductive path and the fifth conductive path are electrically coupled together (e.g., via the third bit line 124$bl_3$). In further embodiments, the second conductive path and the sixth conductive path are electrically coupled together (e.g., via the second bit line 124$bl_2$).

In some embodiments, a process for forming the lower ILD structure 302 and the lower interconnect structure 308 comprises forming a first ILD layer over the substrate 102 and over the plurality of semiconductor devices 104a-b. Thereafter, contact openings are formed in the first ILD layer. A conductive material (e.g., tungsten (W)) is then formed on the first ILD layer and in the contact openings. Thereafter, a planarization process (e.g., CMP) is performed on the conductive material to form the plurality of conductive contacts 120 in the first ILD layer. A second ILD layer is then formed over the first ILD layer and the plurality of conductive contacts 120. A plurality of trenches are then formed in the second ILD layer. A conductive material (e.g., copper (Cu)) is formed on the second ILD layer and in the trenches. Thereafter, a planarization process (e.g., CMP) is performed into the conductive material to form the conductive lines 124 of the first conductive layer 126a.

Thereafter, the conductive vias 122 and the remaining conductive lines 124 of the lower interconnect structure 308 may be formed by repeating a damascene process (e.g., a single damascene process or a dual damascene process) until each of the conductive lines 124 of the second conductive layer 126b; the conductive lines 124 of the third conductive layer 126c; the conductive vias 122 that extend between the first conductive layer 126a and the second conductive layer 126b; and the conductive vias 122 that extend between the second conductive layer 126b and the third conductive layer 126c are formed in the lower ILD structure 302.

The damascene process is performed by depositing a subsequent ILD layer over the second ILD layer and the conductive lines 124 of the first conductive layer 126a, etching the subsequent ILD layer to form one or more via holes and/or one or more trenches in the subsequent ILD layer, and filling the one or more via holes and/or the one or more trenches with a conductive material (e.g., copper (Cu)). Thereafter, a planarization process (e.g., CMP) is performed on the conductive material, thereby forming the conductive lines 124 of the second conductive layer 126b and/or the conductive vias 122 that extend between the first conductive layer 126a and the second conductive layer 126b. This damascene process is repeated until each of the conductive lines 124 and conductive vias 122 of the lower interconnect structure 308 are formed in the lower ILD structure 302. The ILD layers may be formed by, for example, CVD, PVD, ALD, some other deposition process, or a combination of the foregoing. The conductive material(s) (e.g., tungsten (W), copper (Cu), etc.) may be formed using a deposition process (e.g., CVD, PVD, sputtering, etc.) and/or a plating process (e.g., electrochemical plating, electroless plating, etc.).

Figure 11:
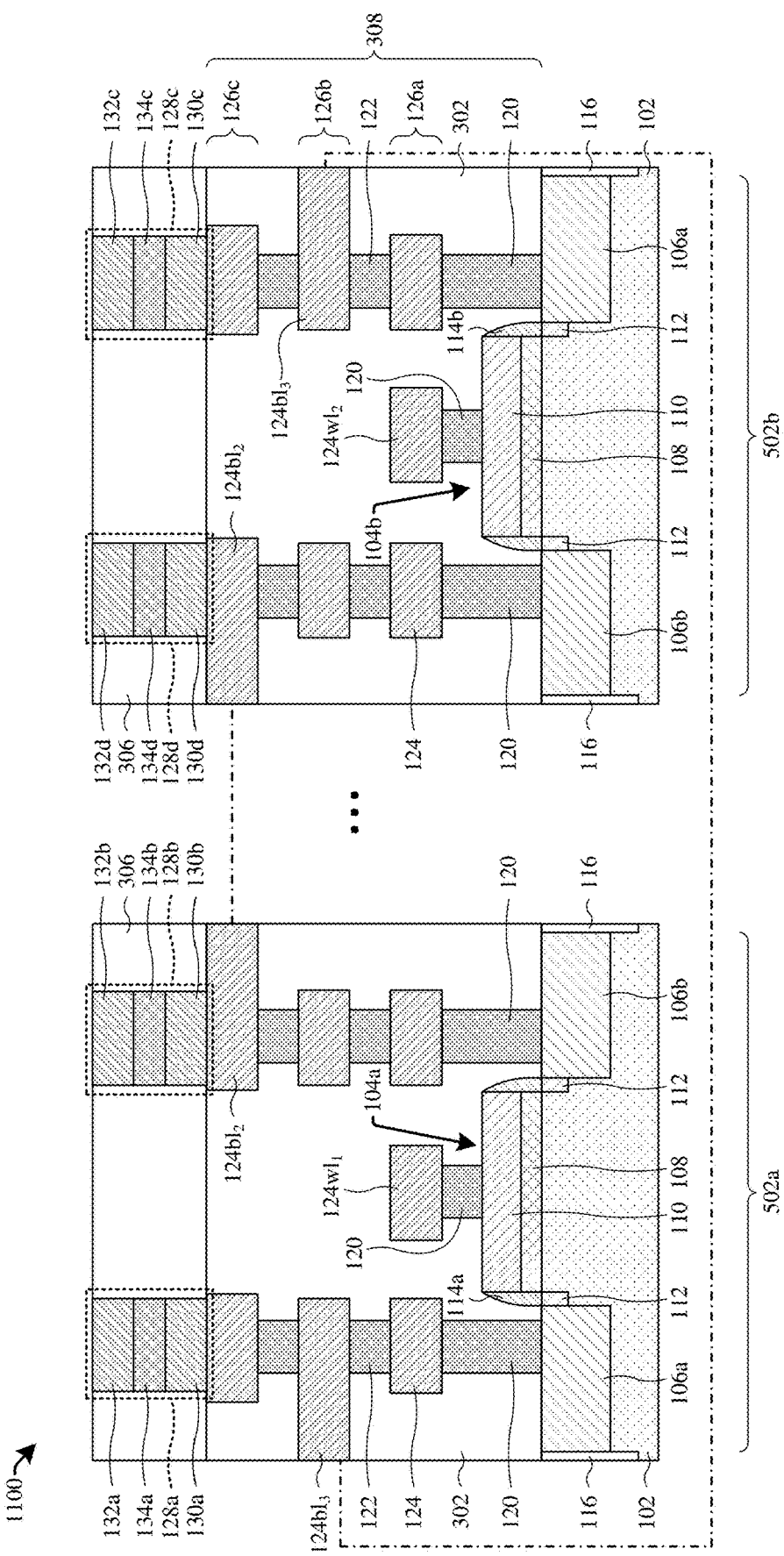

As shown in cross-sectional view 1100 of FIG. 11, a plurality of memory cells 128a-d are formed over the lower ILD structure 302 and the lower interconnect structure 308. For example, a first memory cell 128a, a second memory cell 128b, a third memory cell 128c, and a fourth memory cell 128d are formed over the lower ILD structure 302 and the lower interconnect structure 308. The plurality of memory cells 128a-d comprise a plurality of first electrodes 130a-d, respectively. The plurality of memory cells 128a-d comprise a plurality of second electrodes 132a-d, respectively. The plurality of memory cells 128a-d comprise a plurality of data storage structures 134a-d, respectively.

The first memory cell 128a is formed so that the first electrode 130a of the first memory cell 128a is electrically coupled to the first conductive path of the lower interconnect structure 308. The second memory cell 128b is formed so that the first electrode 130b of the second memory cell 128b is electrically coupled to the second conductive path of the lower interconnect structure 308. The third memory cell 128c is formed so that the first electrode 130c of the third memory cell 128c is electrically coupled to the fifth conductive path of the lower interconnect structure 308. The fourth memory cell 128d is formed so that the first electrode 130d of the fourth memory cell 128d is electrically coupled to the sixth conductive path of the lower interconnect structure 308.

In some embodiments, a process for forming the plurality of memory cells 128a-d comprises depositing a first electrode layer on the lower ILD structure 302 and the conductive lines 124 of the third conductive layer 126c. A data storage layer is then formed on the first electrode layer. A second electrode layer is then formed on the data storage layer. In some embodiments, the first electrode layer, the data storage layer, and the second electrode layer may be deposited or grown by, for example, CVD, PVD, ALD, sputtering, electrochemical plating, electroless plating, or some other deposition process. Thereafter, the second electrode layer, the data storage layer, and the first electrode layer are selectively etched to form the plurality of first electrodes 130a-d, the plurality of data storage structures 134a-d, and the plurality of second electrodes 132a-d. It will be appreciated that, in some embodiments, multiple etching process may be performed to form the plurality of memory cells 128a-d.

In some embodiments, the first electrode layer and the second electrode layer may be or comprise, for example, a metal (e.g., aluminum (Al), titanium (Ti), tantalum (Ta), gold (Au), platinum (Pt), tungsten (W), nickel (Ni), iridium (Ir), etc.), a metal-nitride (e.g., titanium nitride (TiN), tantalum nitride (TaN), etc.), a metal-oxide (e.g., iridium oxide ($IrO_2$)), doped polysilicon (e.g., n-type/p-type polysilicon), or the like. In some embodiments, the data storage layer is or comprises, for example, a chalcogenide (e.g., germanium-antimony-tellurium (GST)), a ferroelectric crystal material (e.g., lead zirconate titanate (PZT)), a metal-oxide (e.g., hafnium oxide ($Hf_xO_y$), zirconium-oxide ($Hf_xZr_yO_z$), etc.), a component-metal-oxide (e.g., hafnium-silicon-oxide ($Hf_xSi_yO_z$), hafnium-aluminum-oxide ($Hf_xAl_yO_z$), strontium titanate (STO), etc.), a metal-oxynitride (e.g., hafnium oxynitride ($Hf_xO_yN_z$)), or some other material that may selectively change between a high resistive state and a low resistive state. In further embodiments, the data storage layer may comprise multiple layers configured to store data based on a resistive state of one or more of the multiple layers. For example, the data storage layer may comprise a first ferromagnetic layer (e.g., iron, cobalt, etc.) separated from a second ferromagnetic layer (e.g., iron, cobalt, etc.) by an insulating layer (e.g., germanium oxide, magnesium oxide, aluminum oxide, etc.) that are patterned into a magnetic tunnel junction (MTJ).

Also shown in the cross-sectional view 1100 of FIG. 11, a middle ILD structure 306 is formed over the lower ILD structure 302 and laterally surrounding the plurality of memory cells 128a-d. In some embodiments, the middle ILD structure 306 is formed with an upper surface that is substantially co-planar with upper surfaces of the plurality of second electrodes 132a-d. In further embodiments, a process for forming the middle ILD structure 306 comprises depositing an ILD layer on the lower ILD structure 302 and over the plurality of memory cells 128a-d. The ILD layer may be deposited by, for example, CVD, PVD, ALD, sputtering, a spin-on process, some other deposition process, or a combination of the foregoing. Thereafter, a planarization process (e.g., CMP) is performed on the ILD layer to remove an upper portion of the ILD layer, thereby forming the middle ILD structure 306 and exposing the plurality of second electrodes 132a-d. In some embodiments, the planarization process may also remove upper portions of the plurality of second electrodes 132a-d.

Figure 12:
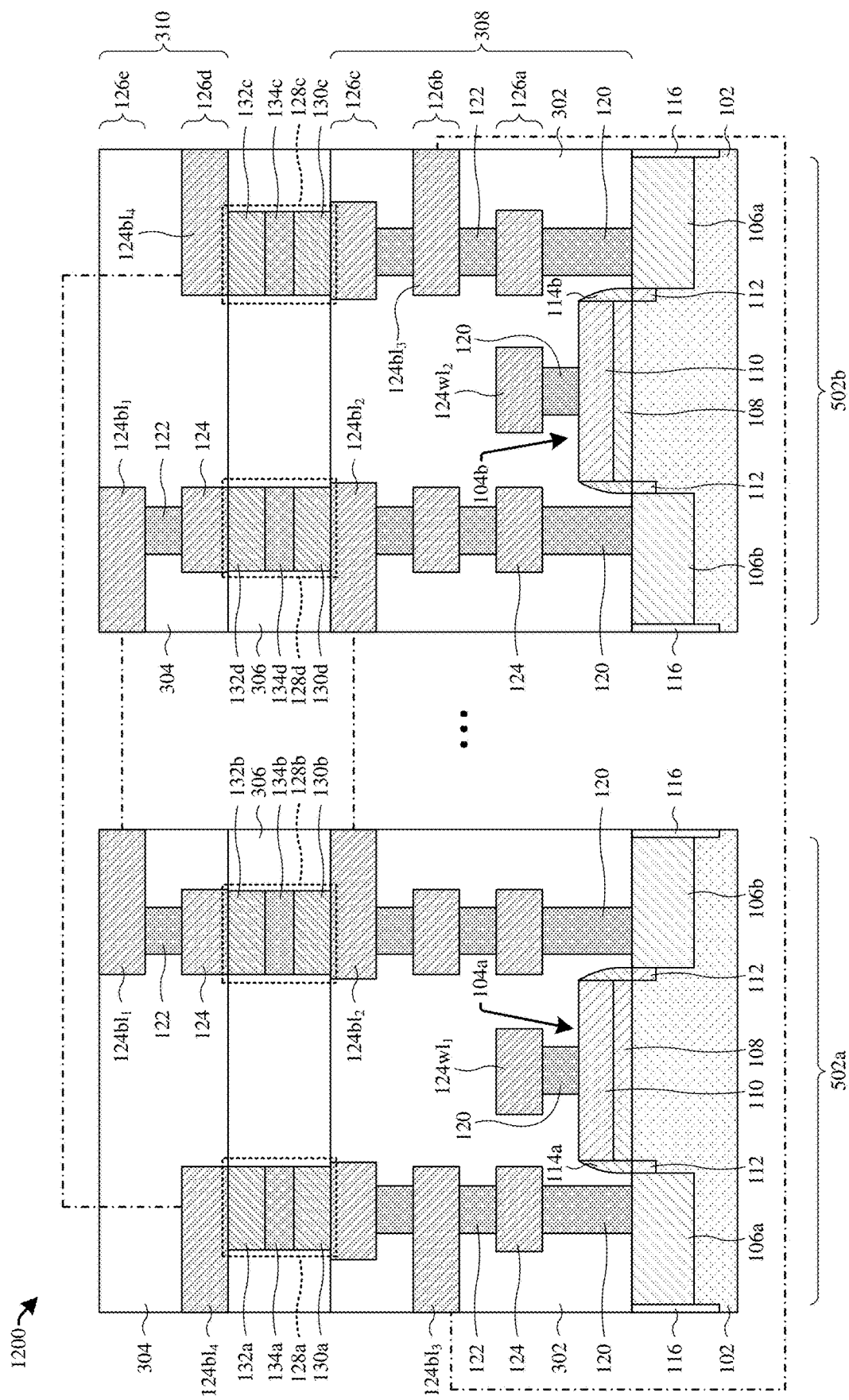

As shown in the cross-sectional view 1200 of FIG. 12, an upper ILD structure 304 is formed over the middle ILD structure 306 and the plurality of memory cells 128a-d. The upper ILD structure 304 comprise one or more stacked ILD layers. Also shown in the cross-sectional view 1200 of FIG. 12, an upper interconnect structure 310 is formed in the upper ILD structure 304. The upper interconnect structure 310 comprises some other of the plurality of conductive lines 124 and some other of the plurality of conductive vias 122. More specifically, the upper interconnect structure 310 comprises the conductive lines 124 of a fourth conductive layer 126d; the conductive lines 124 of a fifth conductive layer 126e; and the conductive vias 122 that extend between the fourth conductive layer 126d and the fifth conductive layer 126c. In some embodiments, the upper ILD structure 304 and the upper interconnect structure 310 are formed in a substantially similar manner as the lower ILD structure 302 and the lower interconnect structure 308 (see, e.g., FIG. 10). Although not shown, it will be appreciated that additional conductive lines 124 and/or additional conductive vias 122 may be formed over the conductive lines 124 of the fifth conductive layer 126e and in the upper ILD structure 304.

The upper interconnect structure 310 is formed with a fifth set of conductive features that are electrically coupled together and define a seventh conductive path. The seventh conductive path is electrically coupled to the second electrode 132a of the first memory cell 128a. The upper interconnect structure 310 is formed with a sixth set of conductive features that are electrically coupled together and define a third conductive path. The third conductive path is electrically coupled to the second electrode 132b of the second memory cell 128b. The seventh conductive path is different than the third conductive path.

The upper interconnect structure 310 is formed with a seventh set of conductive features that are electrically coupled together and define an eighth conductive path. The eighth conductive path is electrically coupled to the second electrode 132c of the third memory cell 128c. The upper interconnect structure 310 is formed with an eighth set of conductive features that are electrically coupled together and define a ninth conductive path. The ninth conductive path is electrically coupled to the second electrode 132d of the fourth memory cell 128d. The eighth conductive path is different than the ninth conductive path.

In some embodiments, the seventh conductive path and the eighth conductive path are electrically coupled together (e.g., via the fourth bit line $124bl_4$). In some embodiments, the seventh conductive path and the eighth conductive path are the same (e.g., are the fourth bit line $124bl_4$). In further embodiments, the third conductive path and the ninth conductive path are electrically coupled together (e.g., via the first bit line $124bl_1$).

Figure 13:
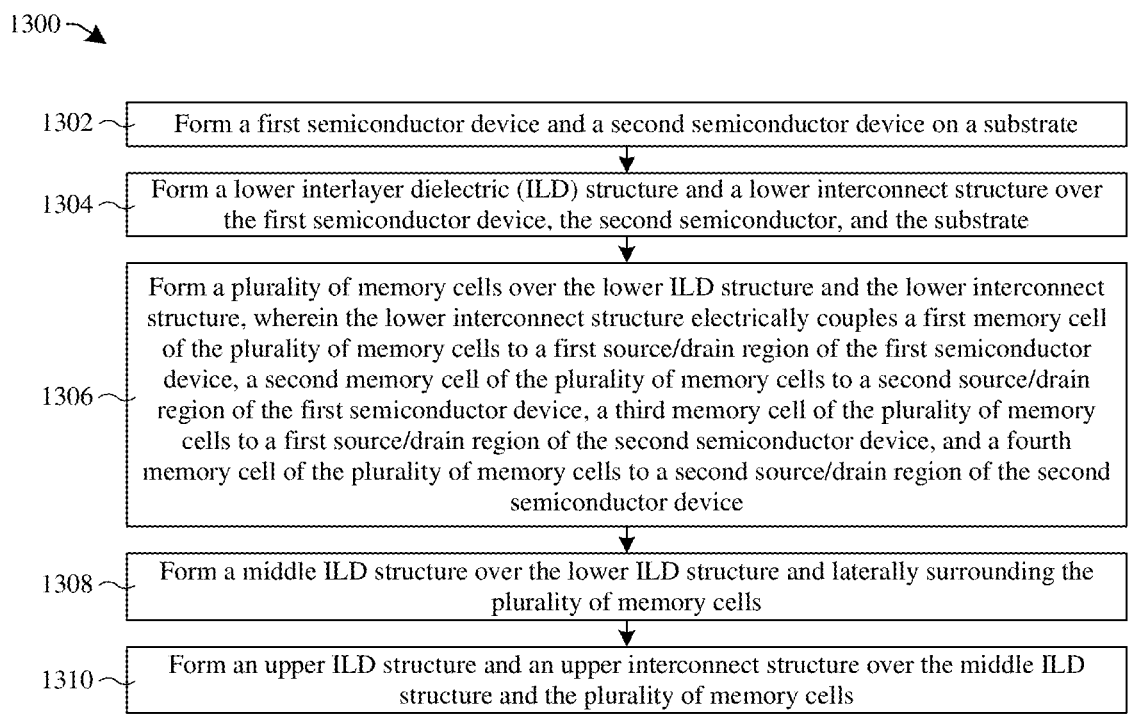
FIG. 13 illustrates a flowchart of some embodiments of a method for forming a memory device that has increased memory cell density and reduced crosstalk.

FIG. 13 illustrates a flowchart 1300 of some embodiments of a method for forming a memory device that has increased memory cell density and reduced crosstalk. While the flowchart 1300 of FIG. 13 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1302, a first semiconductor device and a second semiconductor device are formed on a substrate. FIG. 9 illustrates a cross-sectional view 900 of some embodiments corresponding to act 1302.

At act 1304, a lower interlayer dielectric (ILD) structure and a lower interconnect structure are formed over the first semiconductor device, the second semiconductor, and the substrate. FIG. 10 illustrates a cross-sectional view 1000 of some embodiments corresponding to act 1304.

At act 1306, a plurality of memory cells are formed over the lower ILD structure and the lower interconnect structure, wherein the lower interconnect structure electrically couples a first memory cell of the plurality of memory cells to a first source/drain region of the first semiconductor device, a second memory cell of the plurality of memory cells to a second source/drain region of the first semiconductor device, a third memory cell of the plurality of memory cells to a first source/drain region of the second semiconductor device, and a fourth memory cell of the plurality of memory cells to a second source/drain region of the second semiconductor device. FIG. 11 illustrates a cross-sectional view 1100 of some embodiments corresponding to act 1306.

At act 1308, a middle ILD structure is formed over the lower ILD structure and laterally surrounding the plurality of memory cells. FIG. 11 illustrates a cross-sectional view 1100 of some embodiments corresponding to act 1308.

At act 1310, an upper ILD structure and an upper interconnect structure are formed over the middle ILD structure and the plurality of memory cells. FIG. 12 illustrates a cross-sectional view 1200 of some embodiments corresponding to act 1310.

In some embodiments, the present application provides a memory device. The memory device comprises a first transistor comprising a first source/drain region and a second source/drain region, wherein the first source/drain region and the second source/drain region are disposed in a semiconductor substrate. A dielectric structure is disposed over the semiconductor substrate. A first memory cell is disposed in the dielectric structure and over the semiconductor substrate, wherein the first memory cell has a first electrode and a second electrode, wherein the first electrode of the first memory cell is electrically coupled to the first source/drain region of the first transistor. A second memory cell is disposed in the dielectric structure and over the semiconductor substrate, wherein the second memory cell has a first electrode and a second electrode, wherein the first electrode of the second memory cell is electrically coupled to the second source/drain region of the first transistor.

In some embodiments, the present application provides a method for operating a memory device. The method comprises applying a first voltage to a gate electrode of a first transistor via a first word line. A second voltage is applied to a first electrode of a first memory cell via a first bit line, wherein a second electrode of the first memory cell is electrically coupled to a second bit line and to a first source/drain region of the first transistor. A third voltage is applied to a first electrode of a second memory cell via a third bit line. The third voltage is applied to a second electrode of the second memory cell via a fourth bit line, wherein a second source/drain region of the first transistor is electrically coupled to the fourth bit line, and wherein the third voltage is ground.

In some embodiments, the present application provides a method for forming a memory device. The method comprises forming a transistor on a semiconductor substrate. A lower interlayer dielectric (ILD) structure is formed over the semiconductor substrate. A lower portion of an interconnect structure is formed in the lower ILD structure, wherein the lower portion of the interconnect structure comprise a first set of conductive features and a second set of conductive features, wherein the first set of conductive features defines a first conductive path that is electrically coupled to a first source/drain region of the transistor, and the second set of conductive features defines a second conductive path that is different than the first conductive path and is electrically coupled to a second source/drain region of the transistor. A first memory cell is formed over the lower ILD structure and the lower portion of the interconnect structure, wherein the first memory cell is formed so that a first electrode of the first memory cell is electrically coupled to the first set of conductive features. A second memory cell is formed over both the lower ILD structure and the lower portion of the interconnect structure and laterally spaced from the first memory cell, wherein the second memory cell is formed so that a first electrode of the second memory cell is electrically coupled to the second set of conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a transistor over a substrate and comprising a first source/drain region and a second source/drain region;
   a first memory cell electrically coupled to the first source/drain region and overlying and spaced from the first source/drain region; and
   a second memory cell electrically coupled to the second source/drain region and overlying and spaced from the second source/drain region.

2. The memory device according to claim 1, wherein an entirety of the first memory cell and an entirety of the second memory cell overlie and are spaced from the transistor.

3. The memory device according to claim 1, wherein an entirety of the first memory cell directly overlies and is spaced from the first source/drain region, and wherein an entirety of the second memory cell overlies and is spaced from the second source/drain region.

4. The memory device according to claim 1, wherein the first and second memory cells are at a common elevation over the transistor.

5. The memory device according to claim 1, wherein the transistor, the first memory cell, and the second memory cell form a cell, which repeats in a plurality of rows and a plurality of columns.

6. The memory device according to claim 5, further comprising:
   a pair of bit lines respectively and electrically shorted to the first and second source/drain regions and further elongated along a common row of the plurality of rows.

7. The memory device according to claim 1, wherein the first and second memory cells are two-terminal memory cells.

8. A memory device, comprising:
   a plurality of cells in a plurality of rows and a plurality of columns, wherein each of the plurality of cells comprises a first memory cell, a second memory cell, and a transistor electrically coupled to the first and second memory cells; and
   a first conductive line and a second conductive line both extending along a first row of the plurality of rows and electrically coupled to each of the plurality of cells in the first row;
   wherein the plurality of cells comprises a first cell in the first row, and wherein the first and second conductive lines are at different elevations over the transistor of the first cell and are under the first and second memory cells of the first cell.

9. The memory device according to claim 8, wherein the transistor of the first cell is electrically coupled from the first memory cell of the first cell to the second memory cell of the first cell and further from the first conductive line to the second conductive line.

10. The memory device according to claim 8, wherein the first and second memory cells of the first cell respectively overlie and are spaced from individual source/drain regions of the transistor of the first cell.

11. The memory device according to claim 8, further comprising:
    a third conductive line and a fourth conductive line both extending along the first row and electrically coupled to each of the plurality of cells in the first row, wherein the third and fourth conductive lines are over and electrically shorted respectively to the first and second memory cells of the first cell.

12. The memory device according to claim 11, wherein the third and fourth conductive lines are at different elevations over the transistor of the first cell.

13. The memory device according to claim 8, wherein the transistor of the first cell comprises a first source/drain region and a second source/drain region, and wherein the memory device further comprises:
    a first metal structure extending from the first source/drain region to the first conductive line; and
    a second metal structure extending from the second source/drain region to the second conductive line and having a greater height than the first metal structure.

14. The memory device according to claim 8, wherein each of the plurality of cells consists essentially of the first memory cell, the second memory cell, and the transistor.

15. A memory device, comprising:
a plurality of cells in a plurality of rows and a plurality of columns, wherein each of the plurality of cells comprises a first memory cell, a second memory cell, and a transistor electrically coupled to the first and second memory cells; and
a first conductive line and a second conductive line extending along a first row of the plurality of rows and electrically coupled to each of the plurality of cells in the first row;
wherein the plurality of cells comprises a first cell in the first row, wherein the first memory cell of the first cell is over and electrically coupled to the first conductive line, and wherein the second memory cell of the first cell is under and electrically coupled to the second conductive line.

16. The memory device according to claim 15, wherein the transistor of the first cell is electrically shorted to the first conductive line.

17. The memory device according to claim 15, wherein the first memory cell of the first cell has a first sidewall facing away from the second memory cell of the first cell, wherein the second memory cell of the first cell has a second sidewall facing away from the first memory cell of the first cell, and wherein a separation between the first and second sidewalls is less than a width of the transistor of the first cell.

18. The memory device according to claim 15, wherein a top surface of the first memory cell is level with a top surface of the second memory cell.

19. The memory device according to claim 15, further comprising:
a third conductive line and a fourth conductive line extending along the first row and electrically coupled to each of the plurality of cells in the first row, wherein the first memory cell is under and electrically coupled to the third conductive line, and wherein the second memory cell is over and electrically coupled to the fourth conductive line.

20. The memory device according to claim 15, wherein the first and second memory cells of the first cell each comprise a bottom electrode, a data storage layer overlying the bottom electrode, and a top electrode overlying the data storage layer.

* * * * *